(12) United States Patent
Farooq et al.

(10) Patent No.: US 8,563,403 B1
(45) Date of Patent: Oct. 22, 2013

(54) THREE DIMENSIONAL INTEGRATED CIRCUIT INTEGRATION USING ALIGNMENT VIA/DIELECTRIC BONDING FIRST AND THROUGH VIA FORMATION LAST

(75) Inventors: Mukta G. Farooq, Hopewell Junction, NY (US); Spyridon Skordas, Wappingers Falls, NY (US); Richard P. Volant, New Fairfield, CT (US); Kevin R. Winstel, East Greenbush, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/534,067

(22) Filed: Jun. 27, 2012

(51) Int. Cl.
*H01L 21/30* (2006.01)
*H01L 21/46* (2006.01)
*H01L 21/8238* (2006.01)
*H01L 21/20* (2006.01)

(52) U.S. Cl.
USPC ........... 438/459; 438/224; 438/387; 438/559; 257/E21.597; 257/E21.667; 257/E23.011

(58) Field of Classification Search
USPC ................ 438/224, 387, 455, 459, 559, 667; 257/E21.597, E21.677, E23.011
See application file for complete search history.

(56) References Cited

U.S. PATENT DOCUMENTS

| | | | |
|---|---|---|---|
| 4,285,969 A | 8/1981 | Galli et al. | |
| 4,939,101 A | 7/1990 | Black et al. | |
| 6,566,232 B1 | 5/2003 | Hara et al. | |
| 6,577,013 B1 | 6/2003 | Glenn et al. | |
| 6,809,421 B1 | 10/2004 | Hayasaka et al. | |
| 6,821,826 B1 | 11/2004 | Chan et al. | |
| 7,157,787 B2 | 1/2007 | Kim et al. | |
| 7,312,487 B2 | 12/2007 | Alam et al. | |
| 7,354,798 B2 | 4/2008 | Pogge et al. | |
| 7,354,862 B2 | 4/2008 | Wong et al. | |
| 7,390,723 B2 | 6/2008 | Chen | |
| 7,410,884 B2 | 8/2008 | Ramanathan et al. | |
| 7,413,979 B2 | 8/2008 | Rigg et al. | |

(Continued)

FOREIGN PATENT DOCUMENTS

| JP | 2008153499 A | 7/2008 |
|---|---|---|
| WO | 2011033601 A1 | 3/2011 |

OTHER PUBLICATIONS

S. Denda; "Process Examination of Through Silicon Via Technology," 2007 IEEE 149 IEEE Polytronic 2007 Conference; pp. 149-152.

(Continued)

*Primary Examiner* — David S Blum
(74) *Attorney, Agent, or Firm* — Cantor Colburn LLP; Catherine Ivers

(57) ABSTRACT

A method includes forming a first integrated circuit (IC) device having a first substrate, an alignment via defined in the first substrate, a first wiring layer over the alignment via, and a first bonding layer over the first wiring layer; forming a second IC device having a second substrate, a second wiring layer over the second substrate, and a second bonding layer over the second wiring layer; bonding the first bonding layer of first IC device to the second bonding layer of second IC device; thinning a backside of the first IC device so as to expose the alignment via; and using the exposed alignment via to form a deep, through substrate via (TSV) that passes through the first IC device, through a bonding interface between the first IC device and second IC device, and landing on the second wiring layer of the second IC device.

20 Claims, 26 Drawing Sheets

(56) References Cited

U.S. PATENT DOCUMENTS

| | | | |
|---|---|---|---|
| 7,427,803 B2 | 9/2008 | Chao et al. |
| 7,435,913 B2 | 10/2008 | Chong et al. |
| 7,494,846 B2 | 2/2009 | Hsu et al. |
| 7,507,637 B2 | 3/2009 | Suh et al. |
| 7,514,116 B2 | 4/2009 | Natekar et al. |
| 7,531,453 B2 | 5/2009 | Kirby et al. |
| 7,564,115 B2 | 7/2009 | Chen et al. |
| 7,589,008 B2 | 9/2009 | Kirby |
| 7,598,523 B2 | 10/2009 | Luo et al. |
| 7,598,617 B2 | 10/2009 | Lee et al. |
| 7,629,249 B2 | 12/2009 | Borthakur |
| 7,666,711 B2 | 2/2010 | Pagaila et al. |
| 7,666,768 B2 | 2/2010 | Raravikar et al. |
| 7,670,950 B2 | 3/2010 | Richardson et al. |
| 7,683,458 B2 | 3/2010 | Akram et al. |
| 7,691,748 B2 | 4/2010 | Han |
| 7,692,310 B2 | 4/2010 | Park et al. |
| 7,692,448 B2 | 4/2010 | Solomon |
| 7,692,946 B2 | 4/2010 | Taufique et al. |
| 7,741,148 B1 | 6/2010 | Marimuthu et al. |
| 7,741,156 B2 | 6/2010 | Pagaila et al. |
| 7,749,899 B2 | 7/2010 | Clark et al. |
| 7,750,459 B2 | 7/2010 | Dang et al. |
| 7,759,165 B1 | 7/2010 | Bajaj |
| 7,759,800 B2 | 7/2010 | Rigg et al. |
| 7,772,880 B2 | 8/2010 | Solomon |
| 7,776,741 B2 | 8/2010 | Reid et al. |
| 7,777,330 B2 | 8/2010 | Pelley et al. |
| 7,786,008 B2 | 8/2010 | Do et al. |
| 7,791,175 B2 | 9/2010 | Pyeon |
| 7,795,134 B2 | 9/2010 | Sulfridge |
| 7,795,139 B2 | 9/2010 | Han et al. |
| 7,795,650 B2 | 9/2010 | Eminoglu et al. |
| 7,795,735 B2 | 9/2010 | Hsu et al. |
| 7,799,613 B2 | 9/2010 | Dang et al. |
| 7,803,714 B2 | 9/2010 | Ramiah et al. |
| 7,812,446 B2 | 10/2010 | Kurita |
| 7,812,459 B2 | 10/2010 | Yu et al. |
| 7,813,043 B2 | 10/2010 | Lusinchi et al. |
| 7,816,227 B2 | 10/2010 | Chen et al. |
| 7,821,107 B2 | 10/2010 | Pratt |
| 7,825,024 B2 | 11/2010 | Lin et al. |
| 7,829,976 B2 | 11/2010 | Kirby et al. |
| 7,830,018 B2 | 11/2010 | Lee |
| 7,830,692 B2 | 11/2010 | Chung et al. |
| 7,834,440 B2 | 11/2010 | Ito et al. |
| 7,838,337 B2 | 11/2010 | Marimuthu et al. |
| 7,838,967 B2 | 11/2010 | Chen |
| 7,838,975 B2 | 11/2010 | Chen |
| 7,843,064 B2 | 11/2010 | Kuo et al. |
| 7,847,379 B2 | 12/2010 | Chung |
| 7,848,153 B2 | 12/2010 | Bruennert et al. |
| 7,859,099 B2 | 12/2010 | Choi et al. |
| 7,863,106 B2 | 1/2011 | Christo et al. |
| 7,863,187 B2 | 1/2011 | Hiatt et al. |
| 7,863,721 B2 | 1/2011 | Suthiwongsunthorn et al. |
| 7,867,821 B1 | 1/2011 | Chin |
| 7,872,332 B2 | 1/2011 | Fay et al. |
| 7,875,948 B2 | 1/2011 | Hynecek et al. |
| 7,883,938 B2 | 2/2011 | Kolan et al. |
| 7,884,015 B2 | 2/2011 | Sulfridge |
| 7,884,016 B2 | 2/2011 | Sprey et al. |
| 7,884,466 B2 | 2/2011 | Ishihara et al. |
| 7,888,668 B2 | 2/2011 | Kuo et al. |
| 7,893,526 B2 | 2/2011 | Mun et al. |
| 7,893,529 B2 | 2/2011 | Hsu et al. |
| 7,898,095 B2 | 3/2011 | Patti et al. |
| 7,900,519 B2 | 3/2011 | Chandrasekaran |
| 7,902,069 B2 | 3/2011 | Andry et al. |
| 7,902,643 B2 | 3/2011 | Tuttle |
| 7,904,273 B2 | 3/2011 | Liu et al. |
| 7,906,431 B2 | 3/2011 | Mistuhashi |
| 7,910,473 B2 | 3/2011 | Chen |
| 7,913,000 B2 | 3/2011 | Chung |
| 7,915,736 B2 | 3/2011 | Kirby et al. |
| 7,923,370 B2 | 4/2011 | Pyeon |
| 7,933,428 B2 | 4/2011 | Sawada |
| 7,936,052 B2 | 5/2011 | Barth et al. |
| 7,939,369 B2 | 5/2011 | Farooq et al. |
| 7,939,941 B2 | 5/2011 | Chiou et al. |
| 7,943,473 B2 | 5/2011 | Ellul et al. |
| 7,943,513 B2 | 5/2011 | Lin |
| 7,952,171 B2 | 5/2011 | Pratt |
| 7,958,627 B2 | 6/2011 | Randall et al. |
| 7,960,242 B2 | 6/2011 | Or-Bach et al. |
| 7,960,282 B2 | 6/2011 | Yelehanka et al. |
| 7,964,916 B2 | 6/2011 | Or-Bach et al. |
| 7,973,413 B2 | 7/2011 | Kuo et al. |
| 7,977,158 B2 | 7/2011 | Kurita |
| 7,986,042 B2 | 7/2011 | Or-Bach et al. |
| 7,989,318 B2 | 8/2011 | Yang et al. |
| 8,008,192 B2 | 8/2011 | Sulfridge |
| 8,014,166 B2 | 9/2011 | Yazdani |
| 2006/0278979 A1 | 12/2006 | Rangel |
| 2007/0117348 A1 | 5/2007 | Ramanathan et al. |
| 2007/0166997 A1 | 7/2007 | Knorr |
| 2009/0004777 A1 | 1/2009 | Kolan et al. |
| 2010/0264551 A1 | 10/2010 | Farooq et al. |

OTHER PUBLICATIONS

R. Hon et al.; "Multi-Stack Flip Chip 3D Packaging with Copper Plated Through-Silicon Vertical Interconnection," IEEE Electronics Packaging Technology Conference, 2005, pp. 384-389.

M. Kawano et al.; "A 3D Packing Technology for 4 Gbit Stacked DRAM with 3 Gbps Data Transfer," 2006 International Electron Devices Meeting; pp. 1-4.

Lee Wen Sheng Vincent et al.; "Cu via Exposure by Backgrinding for TSV Applications," 2007 9th Electronics Packaging Technology Conference; pp. 233-237.

International Search Report and Written Opinion; International Application No. PCT/US2010/030357; International Filing Date: Apr. 8, 2010; Date of Mailing: Jun. 3, 2010; pp. 1-8.

S. Pozder et al.; "Progress of 3D Integration Technologies and 3D Interconnects," IEEE 2007; pp. 213-215.

L. W. Schaper et al.; "Architecural Implications and Process Development of 3-D VLSI Z-Axis Interconnects Using Through Silicon Vias," IEEE Transactions on Advanced Packaging, vol. 28, No. 3, Aug. 2005, pp. 356-366.

THREE DIMENSIONAL INTEGRATED CIRCUIT INTEGRATION USING ALIGNMENT VIA/DIELECTRIC BONDING FIRST AND THROUGH VIA FORMATION LAST

BACKGROUND

The present disclosure relates generally to semiconductor device manufacturing techniques and, more particularly, to implementing three-dimensional integration of multiple integrated circuit (IC) devices using alignment via/dielectric bonding first and through via formation last.

The packaging density in electronic industry continuously increases in order to accommodate more electronic devices into a package. In this regard, three-dimensional (3D) wafer-to-wafer stacking technology substantially contributes to the device integration process. Typically, a semiconductor wafer includes several layers of integrated circuitry (e.g., processors, programmable devices, memory devices, etc.) built on a silicon substrate. A top layer of the wafer may be connected to a bottom layer of the wafer by through-silicon interconnects or vias. In order to form a 3D wafer stack, two or more wafers are placed on top of one other and bonded.

3D wafer stacking technology offers a number of potential benefits, including, for example, improved form factors, lower costs, enhanced performance, and greater integration through system-on-chip (SOC) solutions. In addition, the 3D wafer stacking technology may provide other functionality to the chip. For instance, after being formed, the 3D wafer stack may be diced into stacked dies or chips, with each stacked chip having multiple tiers (i.e., layers) of integrated circuitry. SOC architectures formed by 3D wafer stacking can enable high bandwidth connectivity of products such as, for example, logic circuitry and dynamic random access memory (DRAM), that otherwise have incompatible process flows. At present, there are many applications for 3D wafer stacking technology, including high performance processing devices, video and graphics processors, high density and high bandwidth memory chips, and other SOC solutions.

SUMMARY

In an exemplary embodiment, a method includes forming a first integrated circuit (IC) device having a first substrate, an alignment via defined in the first substrate, a first wiring layer over the alignment via, and a first bonding layer over the first wiring layer; forming a second IC device having a second substrate, a second wiring layer over the second substrate, and a second bonding layer over the second wiring layer; bonding the first bonding layer of first IC device to the second bonding layer of second IC device; thinning a backside of the first IC device so as to expose the alignment via; and using the exposed alignment via to form a deep, through substrate via (TSV) that passes through the first IC device, through a bonding interface between the first IC device and second IC device, and landing on the second wiring layer of the second IC device.

In another embodiment, a method includes forming an alignment via within a first integrated circuit (IC) device; forming a 3D, bonded IC device by bonding the first IC device to a second IC device so as to define a first bonding interface therebetween; thinning the 3D bonded IC device so as to expose the alignment via; using the exposed alignment via to form a first set of vias that pass through the first IC device, through the first bonding interface and into the second IC device, and land on conductive pads located within the second IC device; and forming a second set of vias within the first IC device that land on conductive pads located within the first IC device, and that do not pass through the first bonding interface.

In another embodiment, a three-dimensional (3D) integrated circuit (IC) device includes a first IC device bonded to a second IC device at a first bonding interface therebetween, thereby defining a 3D, bonded IC device, the first bonding interface defined between a first insulating layer of the first IC device and second insulating layer of the second IC device, wherein the first bonding interface is absent of electrically conductive materials; a first set of vias defined within the 3D bonded IC device, the first set of vias landing on conductive pads located within the first IC device, and a second set of vias defined within the 3D bonded IC device, the second set of vias landing on conductive pads located within the second device, such that the second set of vias passes through the first bonding interface; and the first and second sets of vias filled with a conductive material, and electrically connecting at least one via of the first set of vias to at least one via of the second set of vias, thereby establishing electrical communication between the first and second ICs of the 3D bonded IC device.

BRIEF DESCRIPTION OF THE SEVERAL VIEWS OF THE DRAWINGS

Referring to the exemplary drawings wherein like elements are numbered alike in the several Figures:

FIGS. 1 through 16 are a series of cross-sectional views illustrating a method of implementing three-dimensional integration of multiple integrated circuit (IC) devices, in accordance with an exemplary embodiment, in which:

FIG. 3 illustrates the wafer of FIG. 2(a) being flipped and aligned with the wafer of FIG. 2(b);

FIG. 4 illustrates bonding of the wafers of FIG. 3 together to form an integrated wafer;

FIG. 5 illustrates the removal of a portion of the thick sacrificial base layer used in forming the top portion of the integrated wafer;

FIG. 6 illustrates passivation and etching operations for via last TSV formation;

FIG. 7 illustrates liner, metal fill and planarizing operations for the TSV structures;

FIG. 8 illustrates the formation of connection straps between shallow and deep TSVs to create electrical communication between the top and bottom portions of the integrated wafer;

FIG. 9 illustrates passivation of the structure in FIG. 8 in preparation of further wafer bonding;

FIG. 10 illustrates the alignment of another wafer having an alignment TSV with the integrated wafer of FIG. 9;

FIG. 11 illustrates bonding of the wafers of FIG. 10;

FIG. 12 illustrates the removal of a portion of the thick sacrificial base layer of the newly bonded wafer;

FIG. 13 illustrates passivation and etching operations for via last TSV formation;

FIG. 14 illustrates liner, metal fill and planarizing operations for the TSV structures;

FIG. 15 illustrates the formation of connection straps between shallow and deep TSVs to create electrical communication between the top and bottom portions of the integrated wafer;

FIG. 16 illustrates a capture pad formed atop the integrated wafer for providing external electrical contact;

FIGS. 17 through 26 are a series of cross-sectional views illustrating additional details regarding implementing three-dimensional integration of multiple IC devices with alignment via/dielectric bonding first and through via formation last, in accordance with another exemplary embodiment, in which:

FIG. 17 illustrates a top wafer having a preformed alignment via bonded to a bottom wafer;

FIG. 18 illustrates thinning of the top wafer of FIG. 17;

FIG. 19 illustrates the deposition of a dielectric film stack;

FIG. 20 illustrates planarization of the dielectric film stack to expose the alignment via fill material;

FIG. 21 illustrates the formation of a first cap layer;

FIG. 22 illustrates the formation of a deep TSV;

FIG. 23 illustrates planarization to expose the metal fill material of both the deep TSV and the alignment via;

FIG. 24 illustrates the formation of a second cap layer;

FIG. 25 illustrates the formation of a dielectric layer and definition of a connecting strap between the deep TSV and the alignment via; and FIG. 26 illustrates final far back end of line (FBEOL) processing of the structure of FIG. 25.

DETAILED DESCRIPTION

One disadvantage associated with the current 3D wafer stacking technology concerns the use of temporary adhesives to bond the wafers temporarily to facilitate thinning and transfer. Such adhesives limit the amount of practical, in-fab processing and raise reliability concerns due to undesirable inherent polymeric adhesive properties, such as thermal stability. In addition, achieving acceptable alignment of conventionally formed pre-existing through substrate vias (TSV) across the entire diameter of a pair of wafers is also difficult, which also creates reliability concerns.

Accordingly, disclosed herein is a method and resulting structure for 3D wafer integration bonding in which the TSVs are formed post bonding of wafers where a top wafer includes a prebuilt alignment via therein that serves as an alignment mark. In this manner, the actual bonding involves non-via bonding (e.g., oxide-to-oxide bonding, or more generally insulator-to-insulator bonding, permanent adhesive bonding, etc.) of the wafers, in that because the deep TSVs are not formed on the individual wafers prior to bonding, there are no alignment issues therebetween with respect to the deep TSVs.

It should be appreciated that although specific wafer substrate bonding process flows are depicted herein, such descriptions are exemplary only, and that the principles disclosed herein are also applicable to various types of TSV conductive materials, dielectric and adhesive interface materials, and multiple types of semiconductor wafers and substrates. As such, the acronym "TSV" may also be used to more generally refer to "through substrate via" in addition to the conventional "through silicon via" meaning. Moreover, such bonding may include arrangements such as face-to-face, face-to-back, and face-to-face-to-back bonding, and such bonded structures may also incorporate microelectromechanical system (MEMS) structures as well.

Figure 1A:
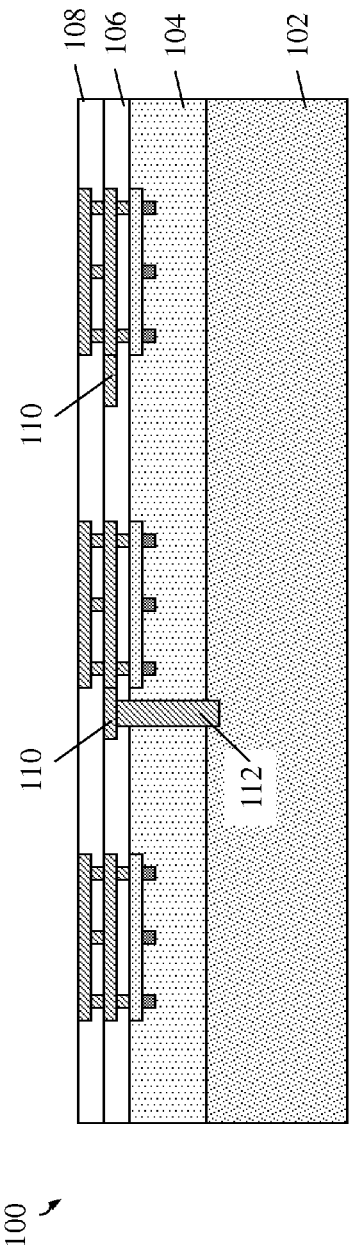
FIG. 1(a) is a cross-sectional view of a first wafer having an alignment TSV to be integrated and bonded with one or more additional wafers.

Referring initially to FIG. 1(a), there is shown a cross-sectional view of a first wafer 100 to be integrated and bonded with one or more additional wafers. In the exemplary embodiment depicted, the wafer 100 generally represents a memory wafer having front-end-of-line (FEOL), middle-of-line (MOL), and back-end-of-line (BEOL) structures formed thereon, as known in the art. However, it should be noted that wafer 100 could be a processor wafer or a wafer with any type of IC devices. The methods presented herein can therefore be used for homogeneous wafer bonding/stacking (i.e., memory to memory, logic to logic, etc., wafer bonding/stacking) or heterogeneous wafer bonding/stacking (memory to logic, etc., wafer bonding/stacking). In addition, the exemplary memory wafer 100 is shown having a thick sacrificial base layer 102 (e.g., a heavily doped P+ layer), and a lightly doped epitaxial layer 104 formed on the sacrificial base layer. The sacrificial base layer 102 may have a dopant concentration of, for example, 1000 times that of the epi-layer 104. The FEOL structures are formed in the epi-layer 104, which serves as the memory layer substrate. As indicated above, this layer 104 could be embodied by a bulk substrate of semiconducting material or a semiconductor-on-insulator (SOI) substrate.

It will be appreciated that the wiring layers (e.g., 106 and 108) shown in the MOL and BEOL regions of the wafer are illustrative only. In an actual device, there may be several layers of insulator materials and associated wiring formed therein. As also shown in FIG. 1(a), one or more strap/landing pads 110 are formed in the wiring layers. For purposes of illustration, the pads are shown at the M1 (first) level of wiring, although such pads can be formed at various levels within the device.

As is further depicted in FIG. 1(a), an alignment via 112 is also formed within the first wafer 100, which alignment via 112 is in contact with one of the landing pads 110, extending through the epi-layer 104 and into a portion of the sacrificial base layer 102. As is described below, the alignment via 112 facilitates alignment using conventional lithography systems and with better accuracy and less complexity than with IR techniques. For example, the use of the alignment via 112 eliminates the need for forming a special alignment mark. Moreover, the alignment via 112 can also be used for making intermediate connections between substrates and reduce the number of shallow TSVs that need to be formed in addition to the deep TSVs.

Figure 1B:
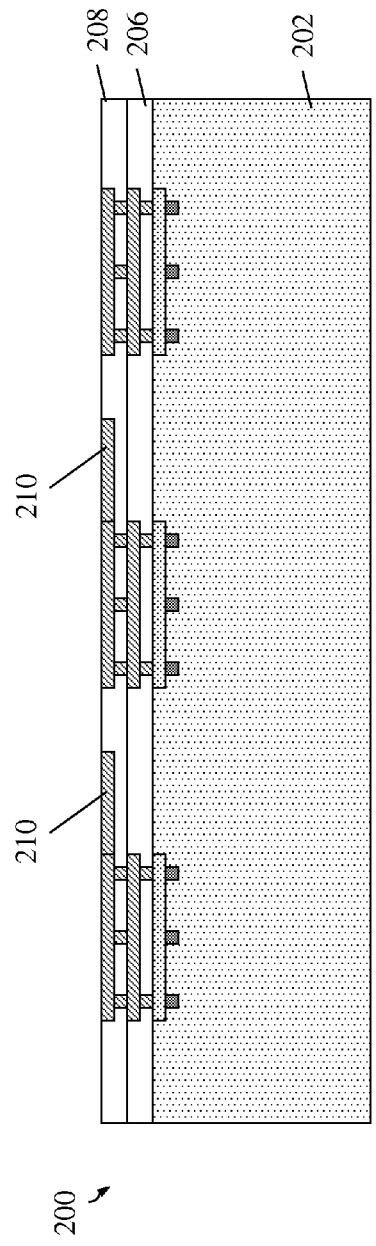
FIG. 1(b) is a cross-sectional view of a second wafer to be integrated and bonded with the first wafer shown in FIG. 1(a)

Referring now to FIG. 1(b), there is shown a cross-sectional view of a second wafer 200 to be integrated and bonded with the first wafer 100 shown in FIG. 1(a). In the exemplary embodiment depicted, the wafer 200 represents a processor wafer having FEOL, MOL and BEOL structures formed thereon, as known in the art. In addition, the exemplary wafer 200 is shown having a base substrate layer 202 (e.g., a P-type layer), which may be embodied by a bulk substrate of semiconducting material such as silicon or an SOI substrate. Again, the wiring layers (e.g., 206 and 208) shown in the MOL and BEOL regions of the wafer 200 are illustrative only. As is the case with the memory wafer 100, the processor wafer 200 also includes metal strap/landing pads 210 formed in one or more of the wiring layers. However, it should be noted that the wafer 200 could be a memory wafer or a wafer with any type of IC devices. The methods presented herein can therefore be used for homogeneous wafer bonding/stacking (i.e., memory to memory, logic to logic, etc., wafer bonding/stacking) or heterogeneous wafer bonding/stacking (memory to logic, etc., wafer bonding/stacking).

Figure 2A:
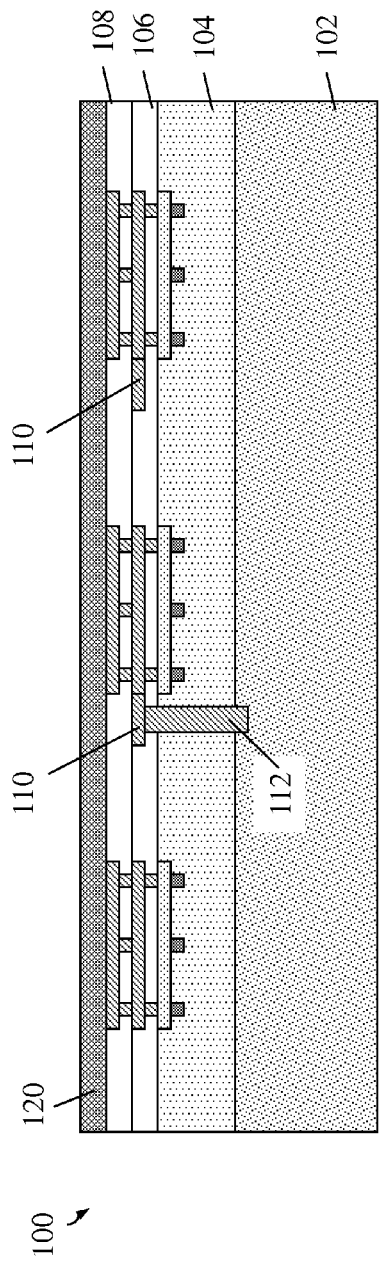
FIG. 2(a) illustrates passivation of the wafer of FIG. 1(a) in preparation of wafer bonding.
Figure 2B:
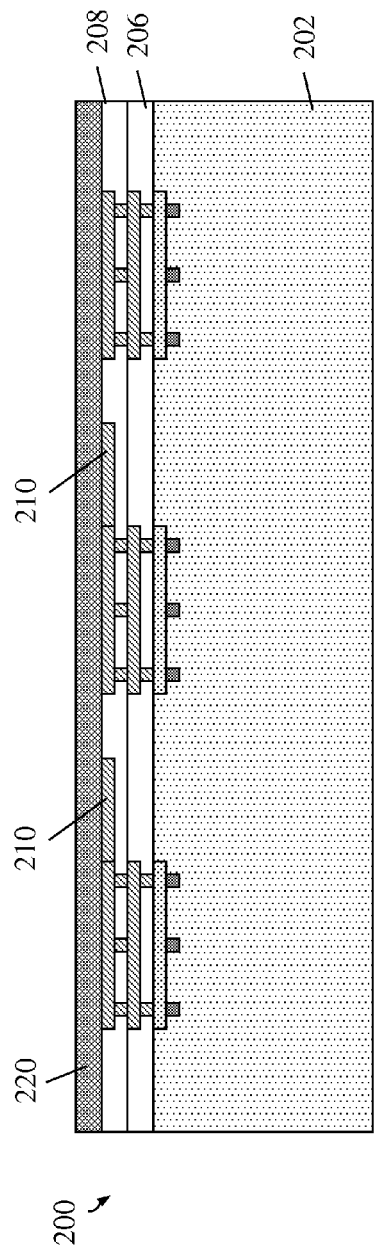
FIG. 2(b) illustrates passivation of the wafer of FIG. 1(b) in preparation of wafer bonding.
Figure 3:
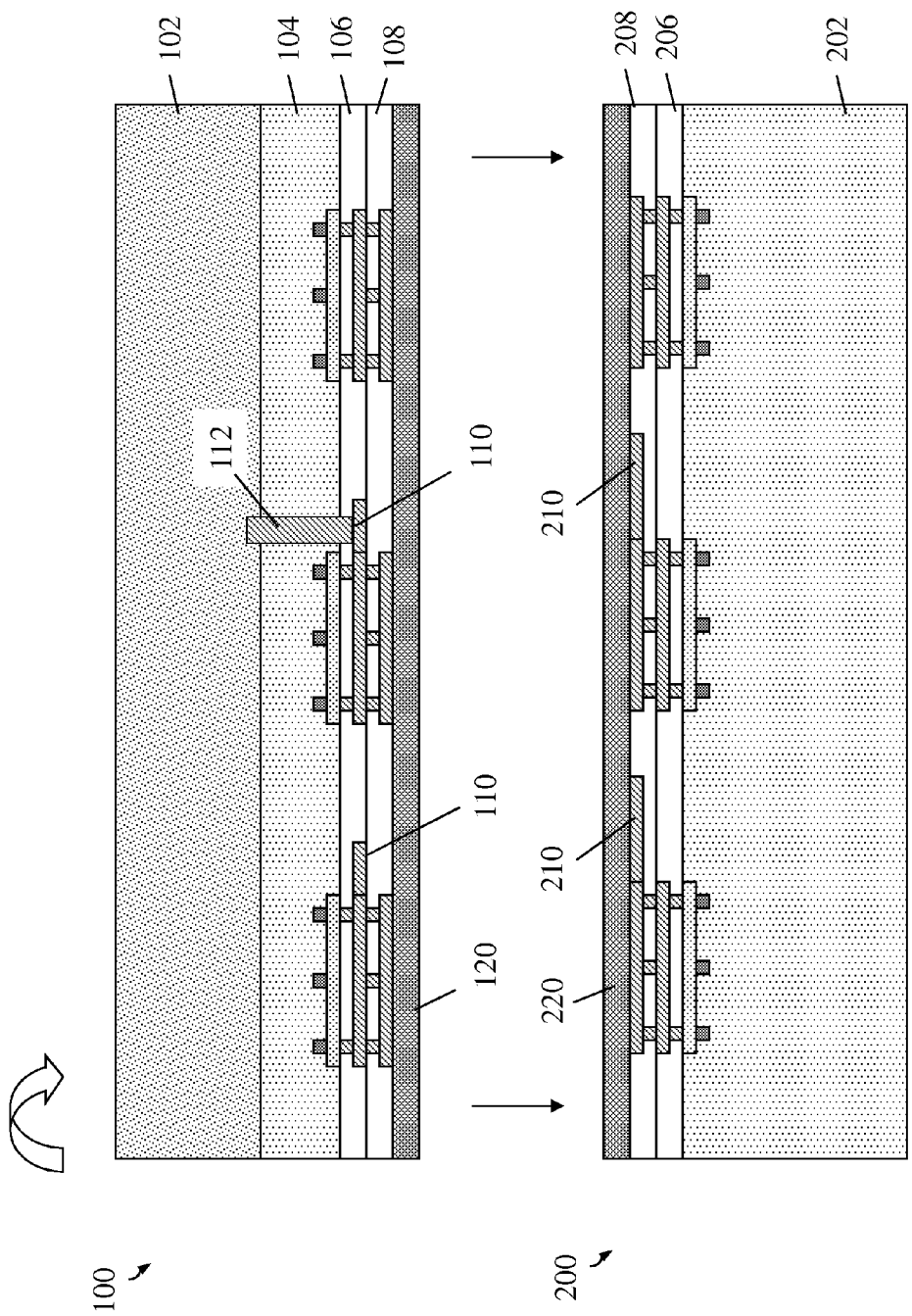

FIGS. 2(a) and 2(b) depict passivation of the wafers 100, 200, respectively, with an oxide layer 120, 220, or other suitable type of insulator material (including any permanent adhesive material) in preparation of wafer bonding. Although not specifically shown in FIGS. 2(a) and 2(b), the passivation layers 120, 220 may also include metal regions defined therein. Both passivated wafers 100, 200 are then shown together in FIG. 3 where, in particular, memory wafer 100 (with the alignment via 112 buried therein) is flipped and aligned with processor wafer 200. Such alignment may be implemented through any known techniques such as, for example, conventional optical alignment, infrared (IR) alignment or other suitable method. It will be noted that since no deep TSVs have been formed in either of the wafers 100, 200 to this point, there is no need to align any conductor materials between the wafers.

Figure 4:
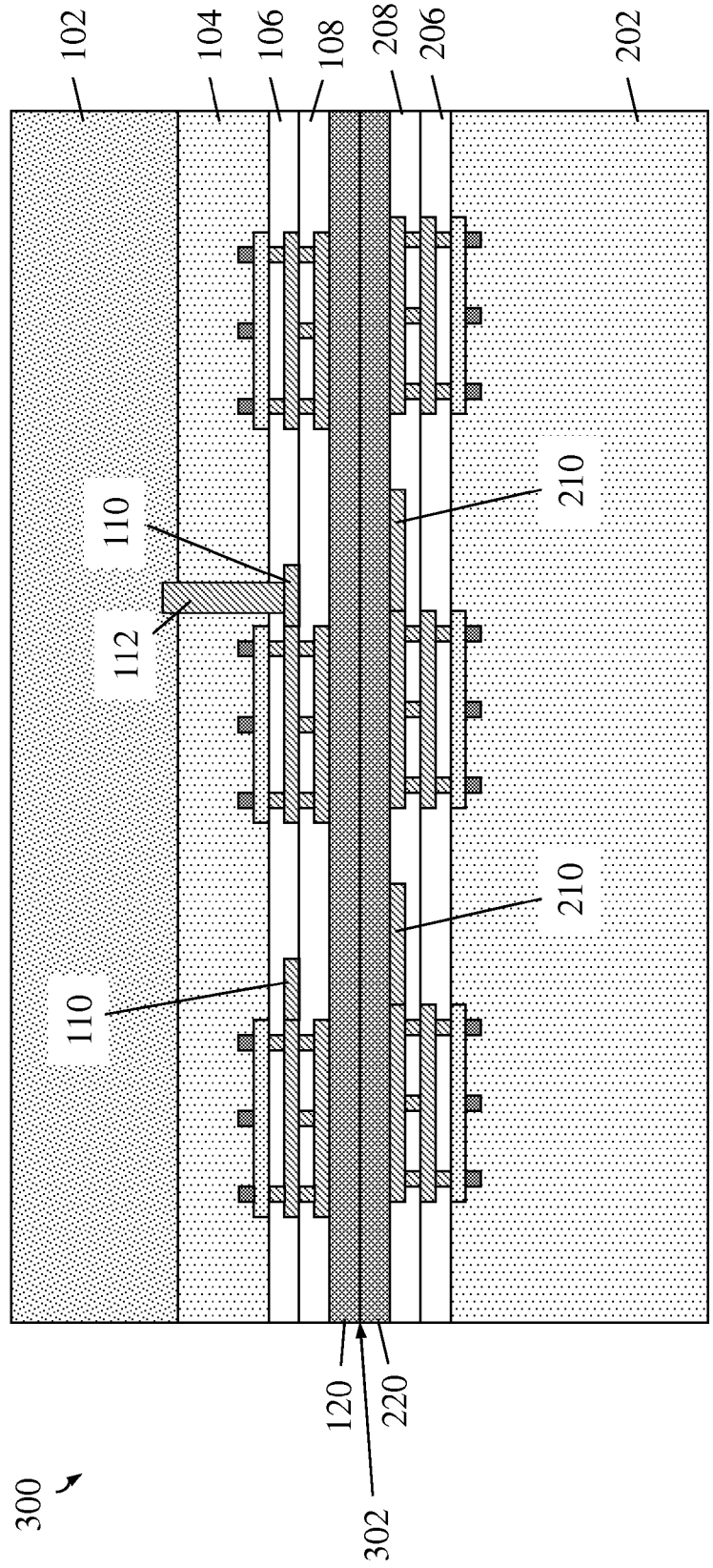

As then shown in FIG. 4, the wafers 100, 200 are bonded together to form an integrated wafer, now depicted generally at 300. Where oxide is used as the passivation material for the individual wafers, the bonding may be, for example, oxide-to-oxide bonding (e.g., by surface activation, clean, initial bonding, and annealing), permanent adhesive bonding, or any other suitable technique known in the art that results in a strong bond between electrically insulating layers. Other exemplary techniques may include metal-to-metal thermal compression bonding, or other type of hybrid bonding technique. Thus bonded, the integrated wafer embodiment 300 has a bonding interface 302 between layers 120 and 220, wherein the interface may be comprised entirely of insulating materials, or of insulating materials having conductive regions (not shown) therein. However, where conductive materials are present in the bonding interface, they do not represent bonded deep TSVs.

It should be appreciated at this point that the exemplary wafers 100, 200 that are bonded to form integrated wafer 300 need not be the specific types of wafers presented in the above example. For instance, a processor wafer could also be "flipped" and bonded to a memory wafer. In addition, one memory wafer could be flipped and bonded in the above described manner to another memory wafer. Even more generally, the wafers 100, 200 may represent any type of integrated circuit device formed on a substrate where it is desired to integrate the same or other types of integrated circuit devices in a 3D fashion.

Figure 5:
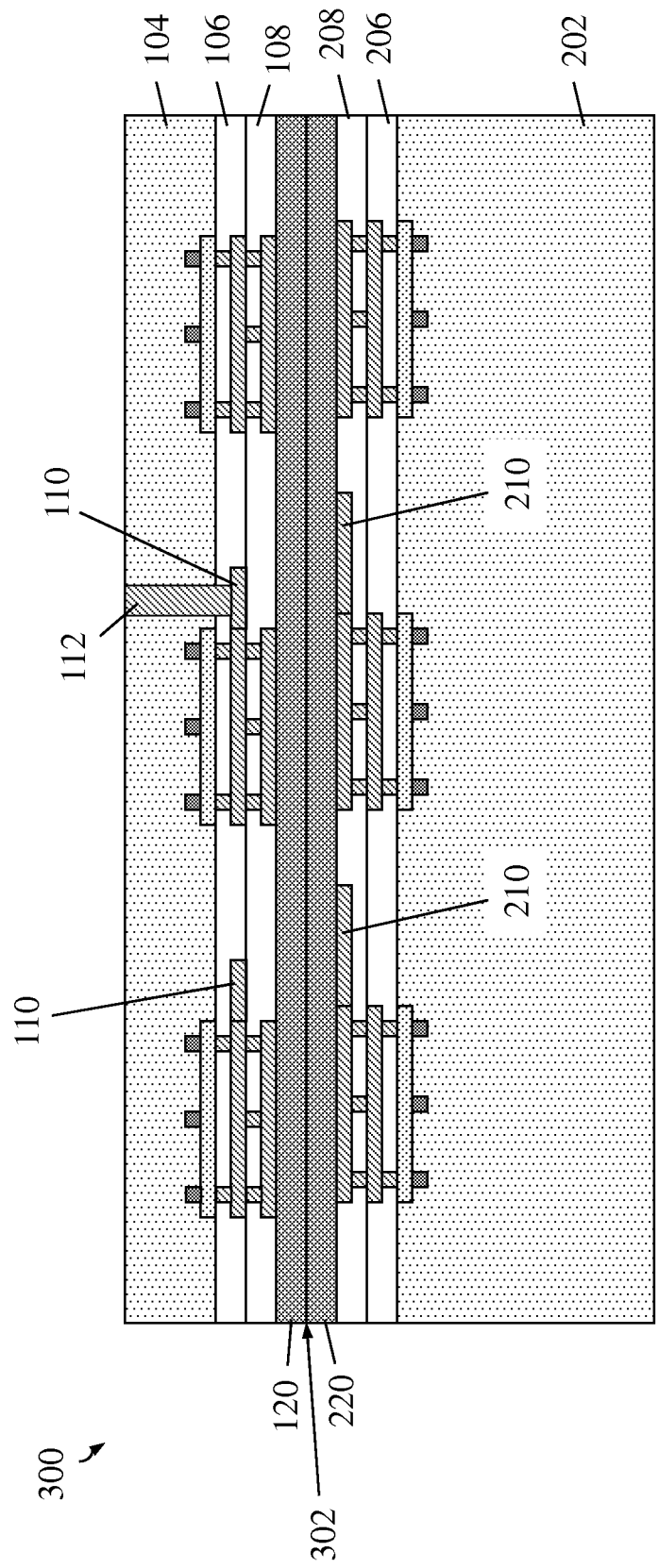

In any case, FIG. 5 illustrates the removal of the thick sacrificial base layer used in forming the memory portion of the wafer 300. The removal may be implemented by any suitable means in the semiconductor arts including, for example, techniques such as grinding, chemical mechanical polishing (CMP), hydrofluoric/nitric/acetic (HNA) acid etching, etc., as well as combinations thereof. By doping the sacrificial base layer at such a higher concentration with respect to the epitaxial layer 104, a strong etch selectivity between the two layers results. Thus, etching becomes one suitable technique for removal of the sacrificial base layer. Upon removal of the sacrificial base layer, the alignment via 112 and the epitaxial layer 104 of the memory portion of the integrated wafer 300 are now exposed for further processing. It should be noted that any combination of the above mentioned thinning methods that results in precise thinning can be used, not necessarily relying on wet thinning and wet thinning stop layers. Therefore, implementation with wafers featuring sacrificial layer without wet etch and/or thinning selectivity layers is possible.

Through the use of the now-exposed, prefabricated alignment via 112, subsequent TSV formation becomes easier by eliminating the need for IR alignment equipment at this point in the processing. In the absence of such an alignment via 112, IR alignment is challenging if done through multiple stacked wafers, in addition to the presence of doped layers. In exemplary embodiments, there may be multiple (e.g., 2 or more) such alignment vias 112 formed in the first wafer prior to bonding and backside thinning.

Figure 6:
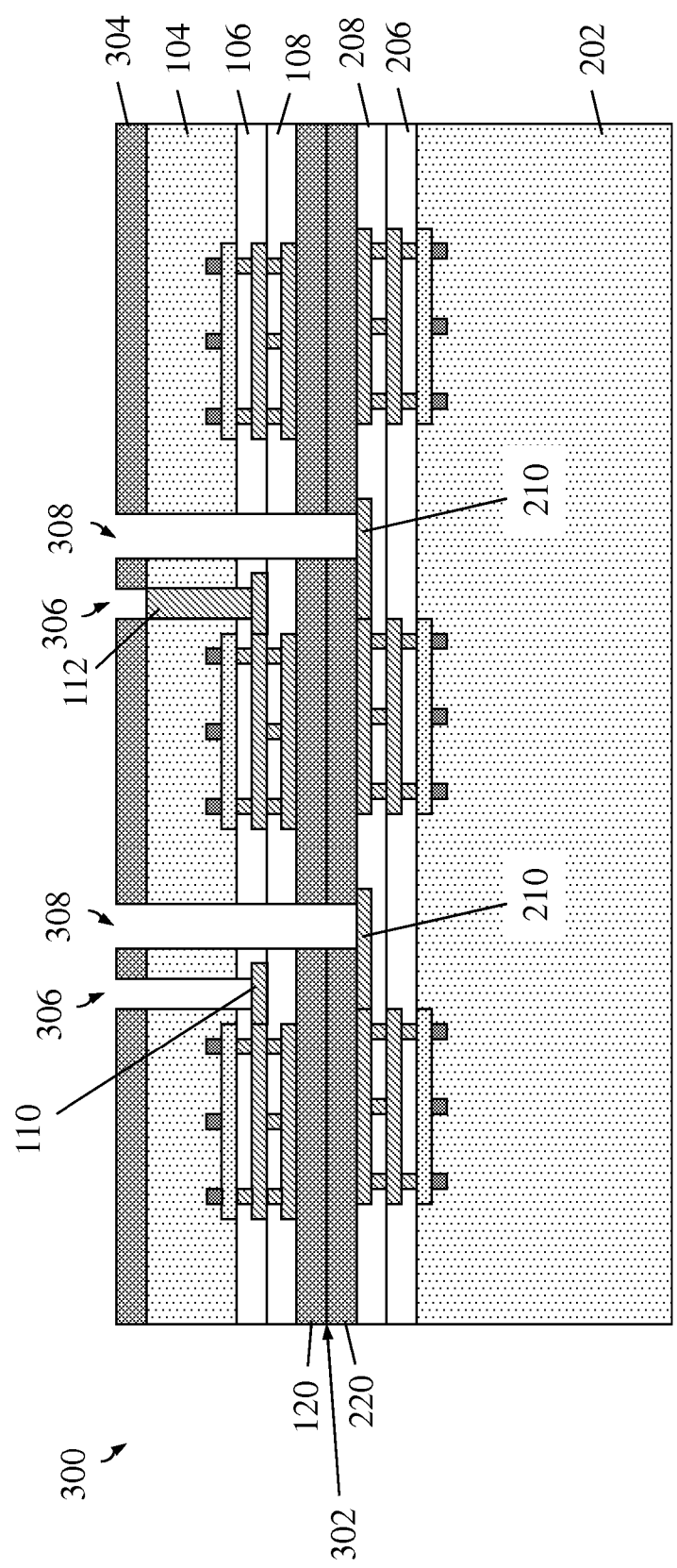

Referring now to FIG. 6, the processing steps for the "via last" TSV formation are commenced, using the alignment via 112 for alignment. This may include, for example, forming a passivation layer 304 (e.g., an oxide) on the epitaxial layer 104. (More detailed exemplary embodiments of the TSV processing are described below.) Then, first and second sets of TSVs are defined by via patterning and etching. More specifically, a "shallow" set of TSVs 306 is formed through the passivation layer 304, the epitaxial layer 104, and one or more of the wiring layers 106, 108 corresponding to the particular locations of the landing pads 110 of the memory portion of the wafer 300. In addition, a "deep" set of TSVs 308 is formed through the entirety of the memory portion of the wafer 300, as well as the passivation layers 120, 220 and the bonding interface 302 therebetween, down to the landing pads 210 in the processor portion of the wafer 300. As is the case with the landing pads 110 in the memory portion, the landing pads 210 in the processor portion may also be located in various wiring levels, and thus the deep TSV etch may continue through one or more of the wiring layers 206, 208 in the event the landing pads 210 are present at these levels.

Figure 7:
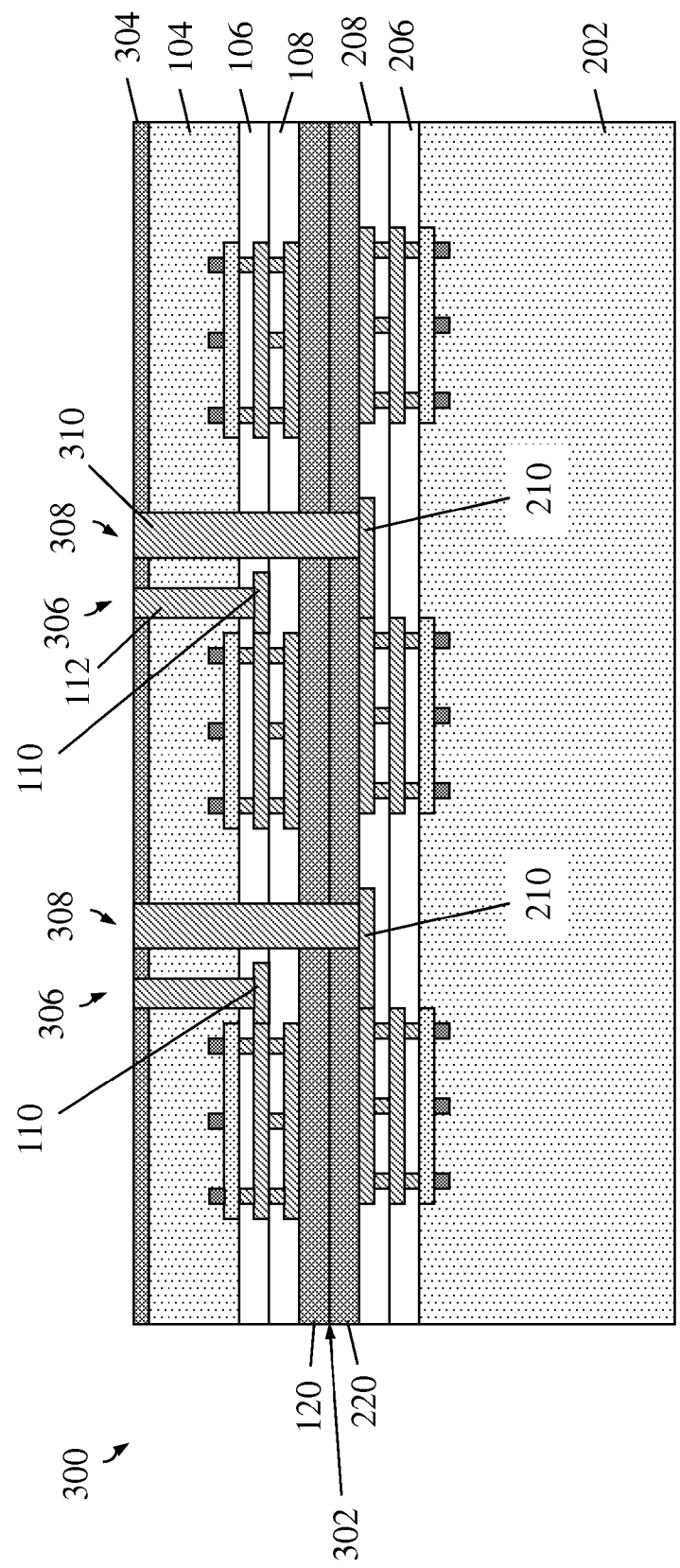

In an exemplary embodiment, the shallow TSVs 306 may have a diameter of about 0.5-50 microns (μm), a total depth of about 5-100 μm, and a pitch (spacing) of about 1-10 μm or more. The deep TSVs 308 may have a diameter of about 1-10 μm, a total depth of about 10-40 μm, and a pitch of about 1-10 μm or more. After the initial etch of both sets of the TSVs, an insulator liner is formed on sidewalls thereof in order to prevent subsequent diffusion of the conductive via fill materials. The deposition of a thin insulator liner is then followed up by an anisotropic etch to remove the liner from the horizontal surfaces, such as the metallic landing pads 110, 210. Then, standard processing may be carried out to form a via liner layer (e.g., tantalum, tantalum nitride, etc.), metal seed layer, and metal fill 310 (e.g., copper), after which the excess material is planarized such as by CMP, as shown in FIG. 7. It will also be noted from FIG. 7 that the originally preformed (i.e., formed prior to wafer bonding) alignment via 112 may now serve as one of the shallow TSVs 306.

Figure 8:
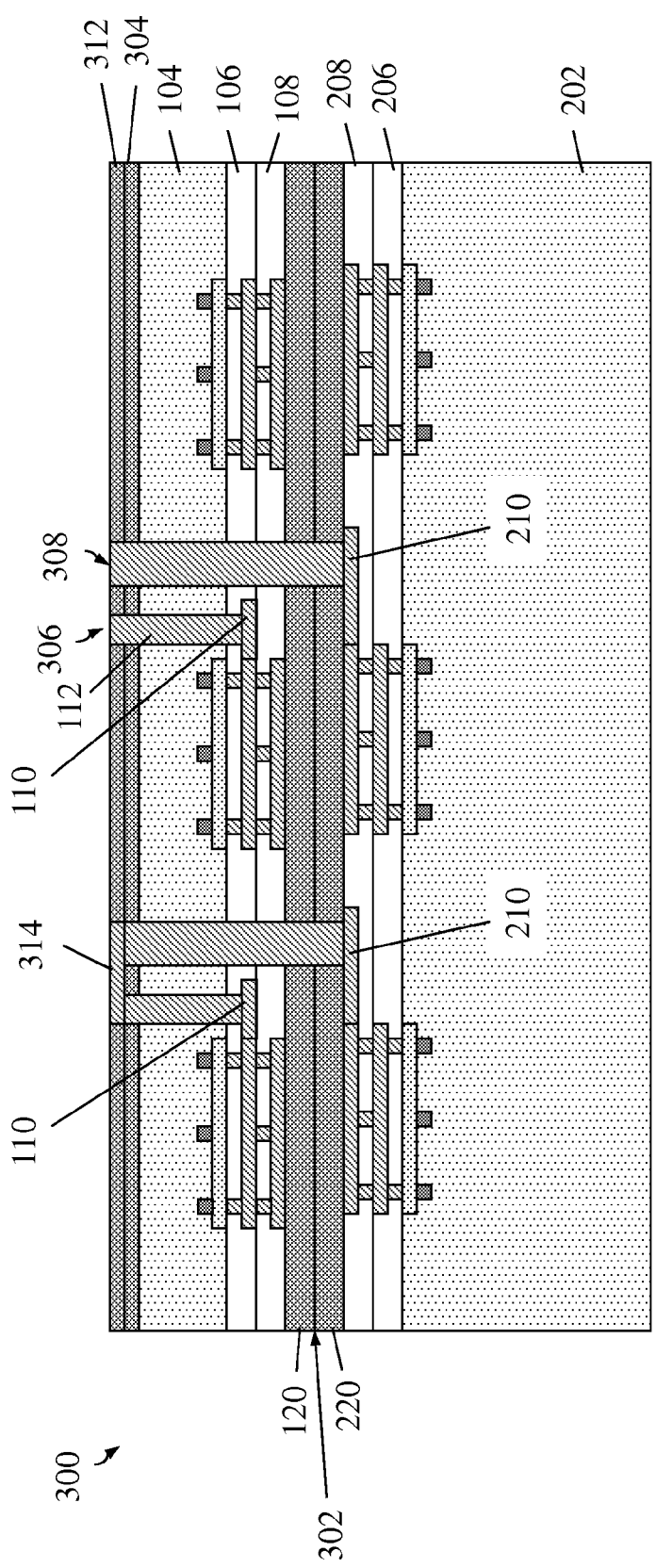

At this point in the process, any connection straps desired between shallow and deep TSVs (thereby defining electrical communication between the processor and memory portions of the integrated wafer 300) may be formed such as shown in FIG. 8. As is shown, another passivation (e.g., oxide) layer 312 is formed, followed by patterning etching, liner layer, seed layer, metal plating and CMP to form a connection strap 314 between a shallow/deep TSV pair. Although the embodiment depicted is an example of single damascene processing, it will be understood that dual damascene processing can also be used to simultaneously define and fill the via and strap structures.

Figure 9:
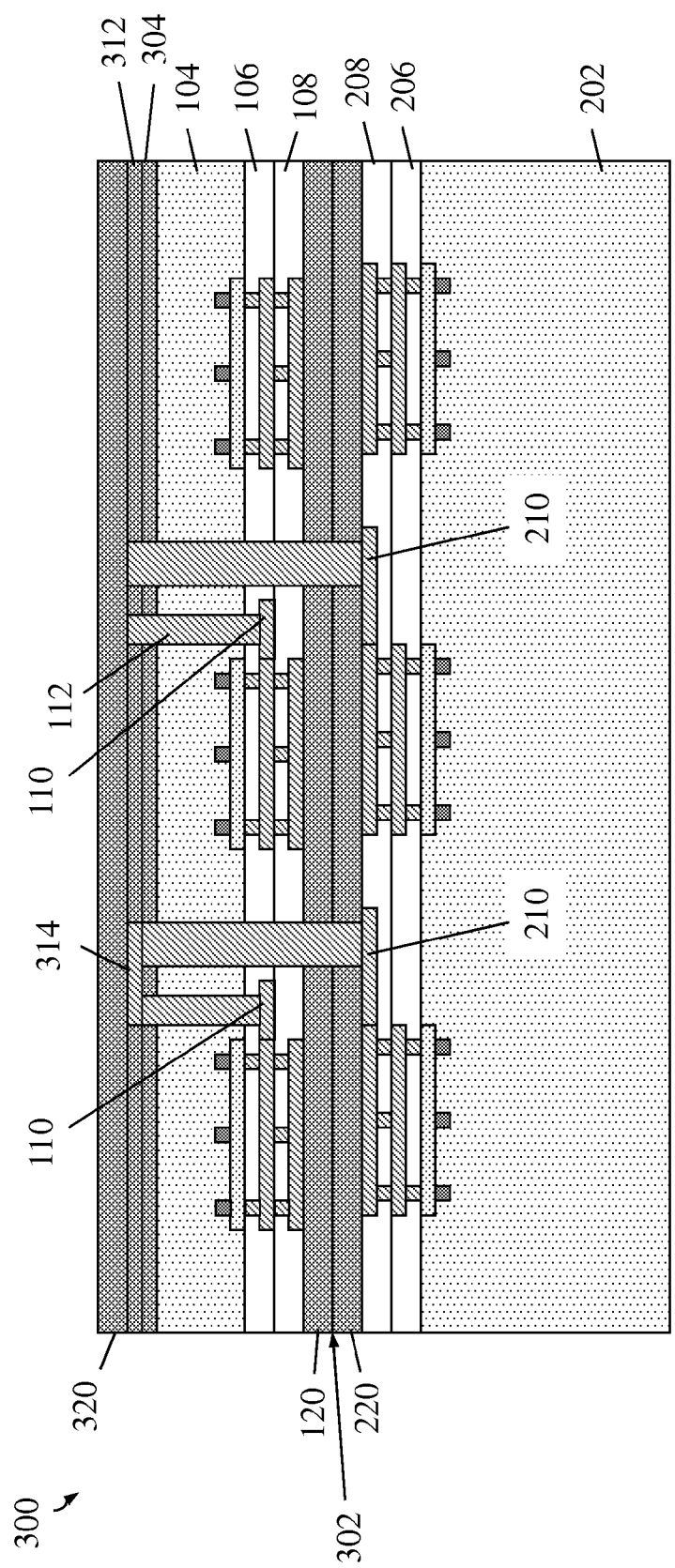

In the event the resulting 3D integrated structure were substantially complete at this point, final processing steps would then be implemented, such as forming a top passivation layer (not shown), patterning the passivation layer and forming a conductive capture pad (not shown) or other metallurgy for an external connection such as a C4 solder ball. However, for purposes of illustration, it will be assumed that further 3D wafer integration is desired, such as (for example) the addition of more memory chips. Accordingly, as shown in FIG. 9, another layer 320 of passivation is formed on the wafer. Layer 320 may be, for example, an oxide layer such as used for layers 120, 220, or other suitable type of insulator material including any adhesive material in preparation of wafer bonding.

Figure 10:
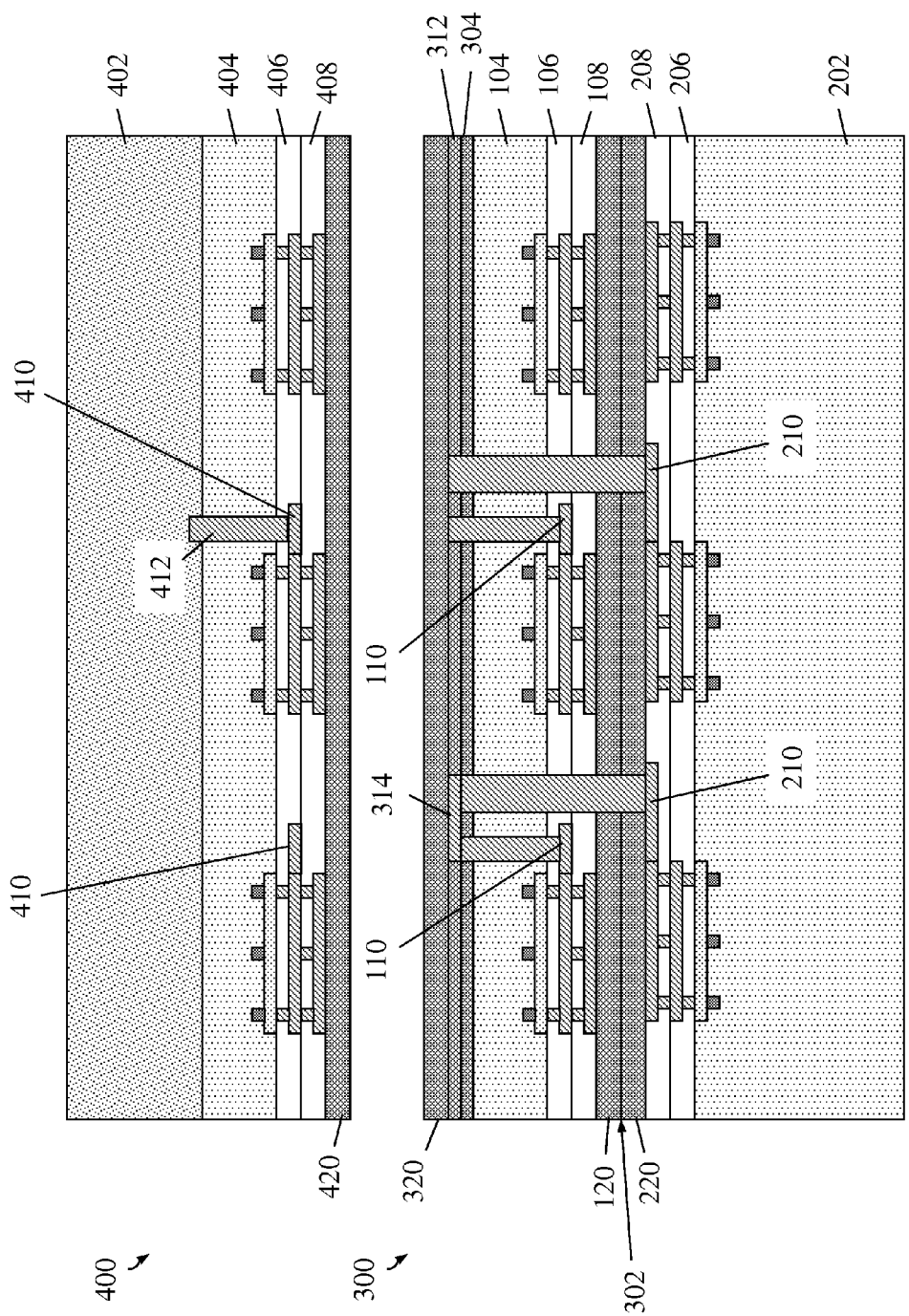
Figure 11:
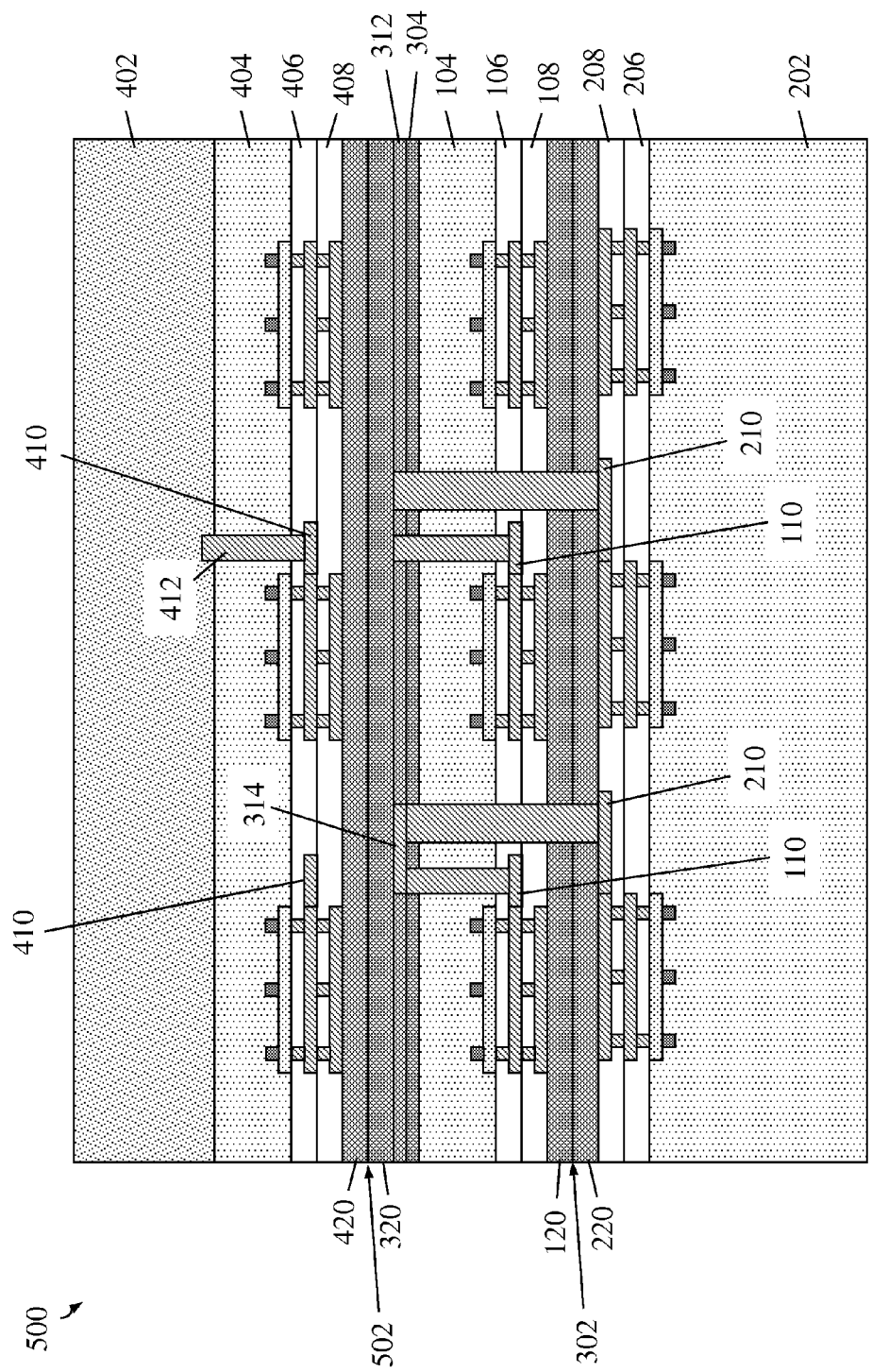

FIG. 10 illustrates the alignment of a second memory wafer 400 with the integrated wafer 300. The second memory wafer 400 is similar in construction with respect to the first memory wafer 100 shown in FIG. 3, in that the wafer 400 includes a thick sacrificial base layer 402 (e.g., a heavily doped P+ layer), a lightly doped epitaxial layer 404 formed on the sacrificial base layer 402, one or more wiring layers 406, 408 in the MOL and BEOL regions, one or more strap/landing pads 410 formed in the wiring layers. In addition, an alignment via 412 is in contact with one of the landing pads 410, extending through the epi-layer 404 and into a portion of the sacrificial base layer 402. As then shown in FIG. 11, the wafers 300 and 400 are bonded together to form a single integrated wafer, now depicted generally at 500. Again, where oxide is used as the passivation material for the individual wafers, the bonding may be, for example, oxide-to-oxide bonding (e.g., by annealing), permanent adhesive bonding, or any other suitable technique known in the art that results in a strong bond between electrically insulating layers. Thus bonded, integrated wafer 500 has a second bonding interface 502 between layers 320 and 520, wherein (like the first bonding interface 302) the second bonding interface 502 may be comprised entirely of insulating materials, or of insulating materials having conductive regions (not shown) therein. However, where conductive materials are present in the bonded interface, they do not represent bonded deep TSVs. However, it should be noted that the wafer 400 could be a processor wafer or a wafer with any type of IC devices. The methods presented herein can therefore be used for homogeneous wafer bonding/stacking (i.e., memory to memory, logic to logic, etc., wafer bonding/stacking) or heterogeneous wafer bonding/stacking (memory to logic, etc., wafer bonding/stacking).

Figure 12:
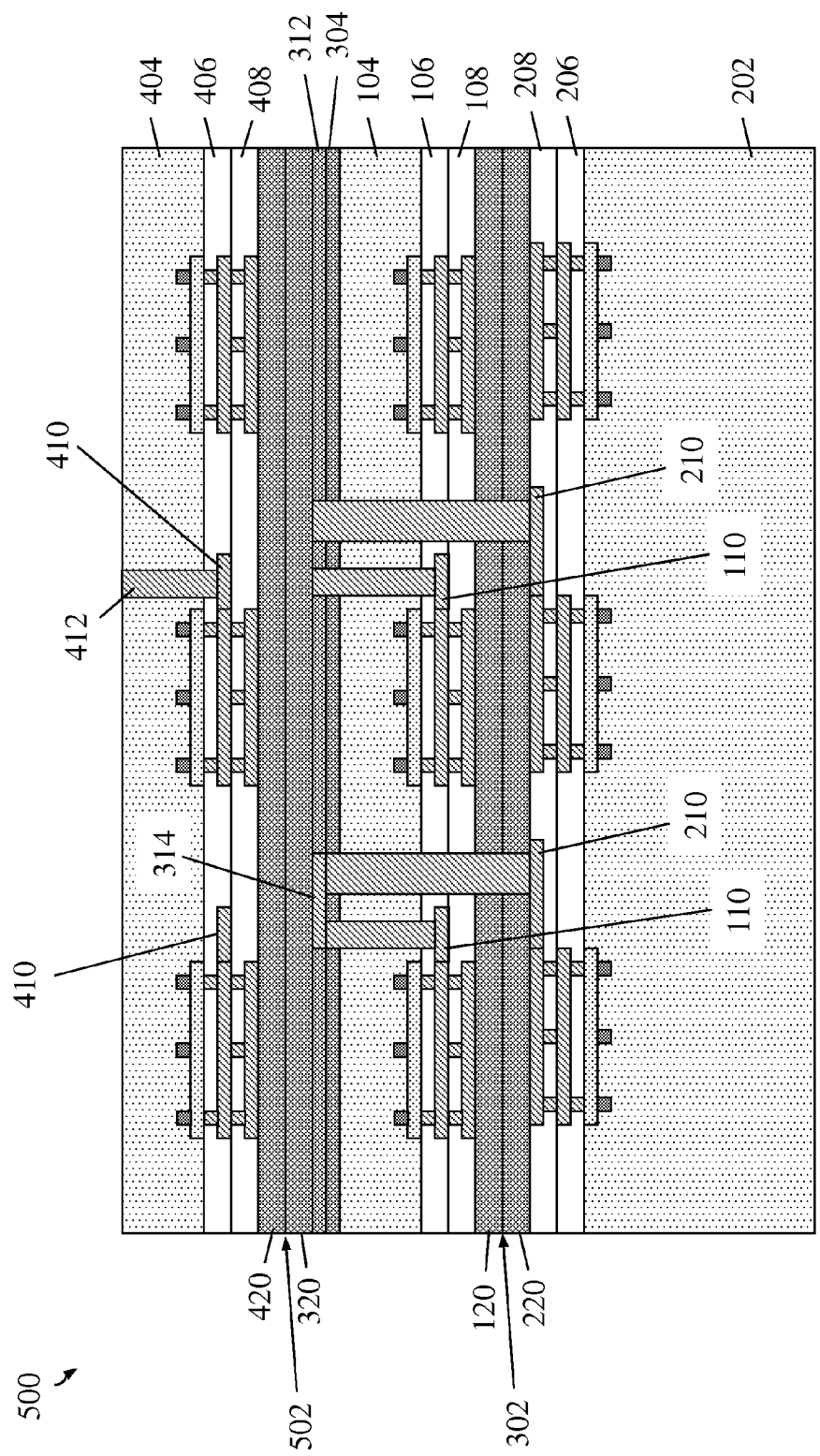

The next steps in the processing sequence are similar to those shown in FIGS. 5-8. For example, in FIG. 12, the thick sacrificial base layer 402 used in forming the second memory wafer 400 is removed by any suitable means in the semiconductor arts such as grinding, CMP, etching, etc. Upon removal of the sacrificial base layer, the epitaxial layer 404 and alignment via 412 of the second memory portion of the integrated wafer 500 is now exposed for further processing. Again, the presence of the alignment via 412 eliminates difficulties associated with IR alignment of the bonded structure.

Figure 13:
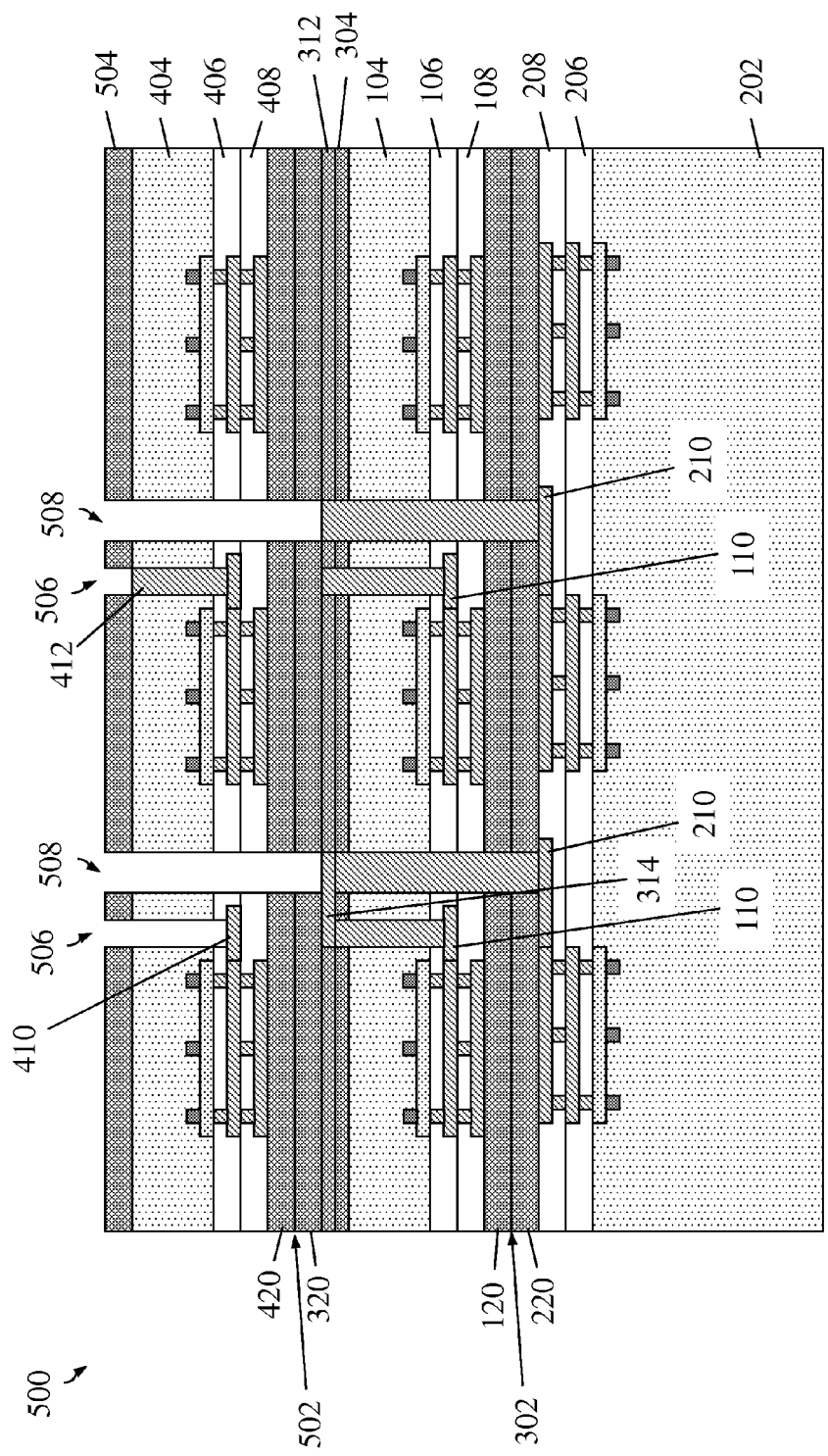

FIG. 13 then illustrates the formation of another set of TSVs, including forming a passivation layer 504 (e.g., an oxide) on the epitaxial layer 404. A shallow set of TSVs 506 is formed through the passivation layer 504, the epitaxial layer 404, and one or more of the wiring layers 406, 408 corresponding to the particular locations of the landing pads 410 of the second memory portion of the wafer 500. Here again, the alignment via 412 may now serve as one of the shallow TSVs. In addition, a deep set of TSVs 508 is formed through the entirety of the second memory portion of the wafer 500, as well as the passivation layers 420 and 320. In the exemplary embodiment depicted, one of the deep TSVs 508 lands on the strap 314 that connects circuitry between the processor and first memory portions of the wafer 500. Another of the deep TSVs 508 is shown to connect to an earlier formed TSV, thereby extending the total depth of the TSV 508 from the top of the device down to the landing strap 210 in the processor portion.

Figure 14:
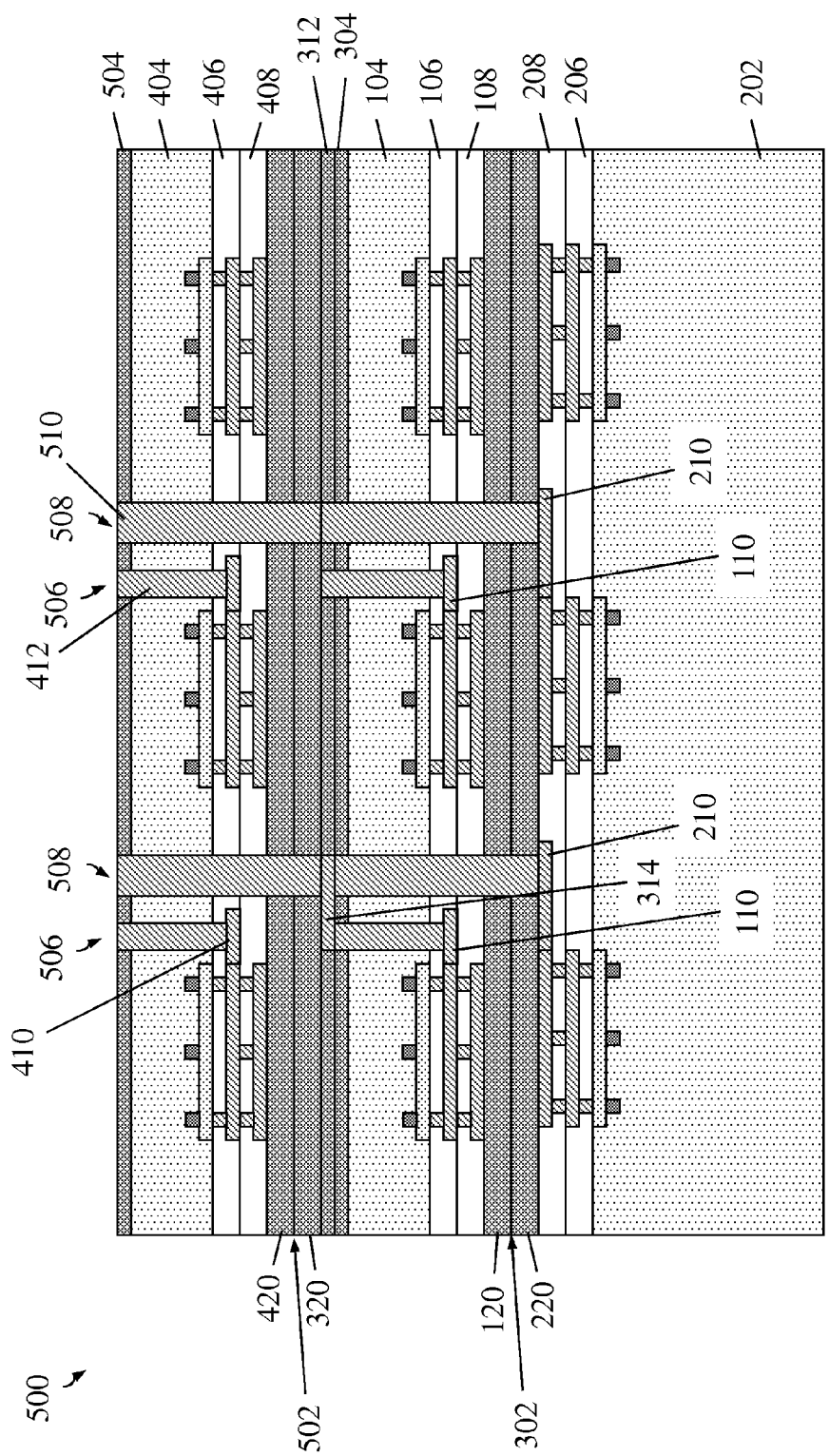
Figure 15:
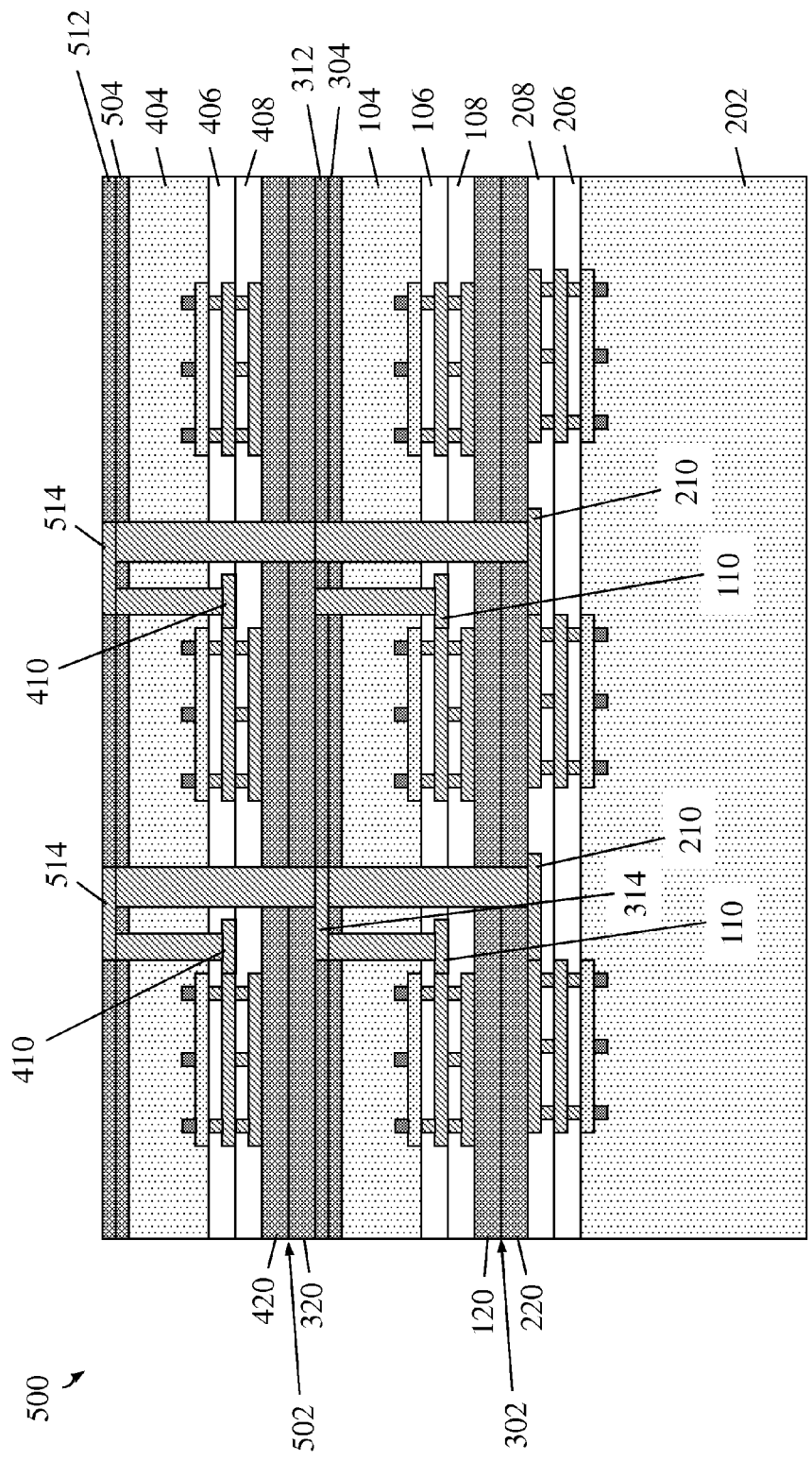

After the etch of both sets of the TSVs 506, 508, an oxide liner is formed on sidewalls thereof in order to prevent subsequent diffusion of the conductive via fill materials. The deposition of the thin oxide liner is then followed up by an anisotropic etch to remove the liner from the horizontal surfaces. Then, standard processing may be carried out to form a via liner layer (e.g., tantalum, tantalum nitride, etc.), metal seed layer, and metal fill 510 (e.g., copper), after which the excess material is planarized such as by CMP, as shown in FIG. 14. In FIG. 15, connection straps between shallow and deep TSVs are formed. In particular, another passivation (e.g., oxide) layer 512 is formed, followed by patterning etching, liner layer, seed layer, metal plating and CMP to form connection straps 514 between the shallow/deep TSV pair. Again, although the illustrated embodiment is an example of single damascene processing, it will be understood that dual damascene processing can also be used to simultaneously define and fill the via and strap structures.

Figure 16:
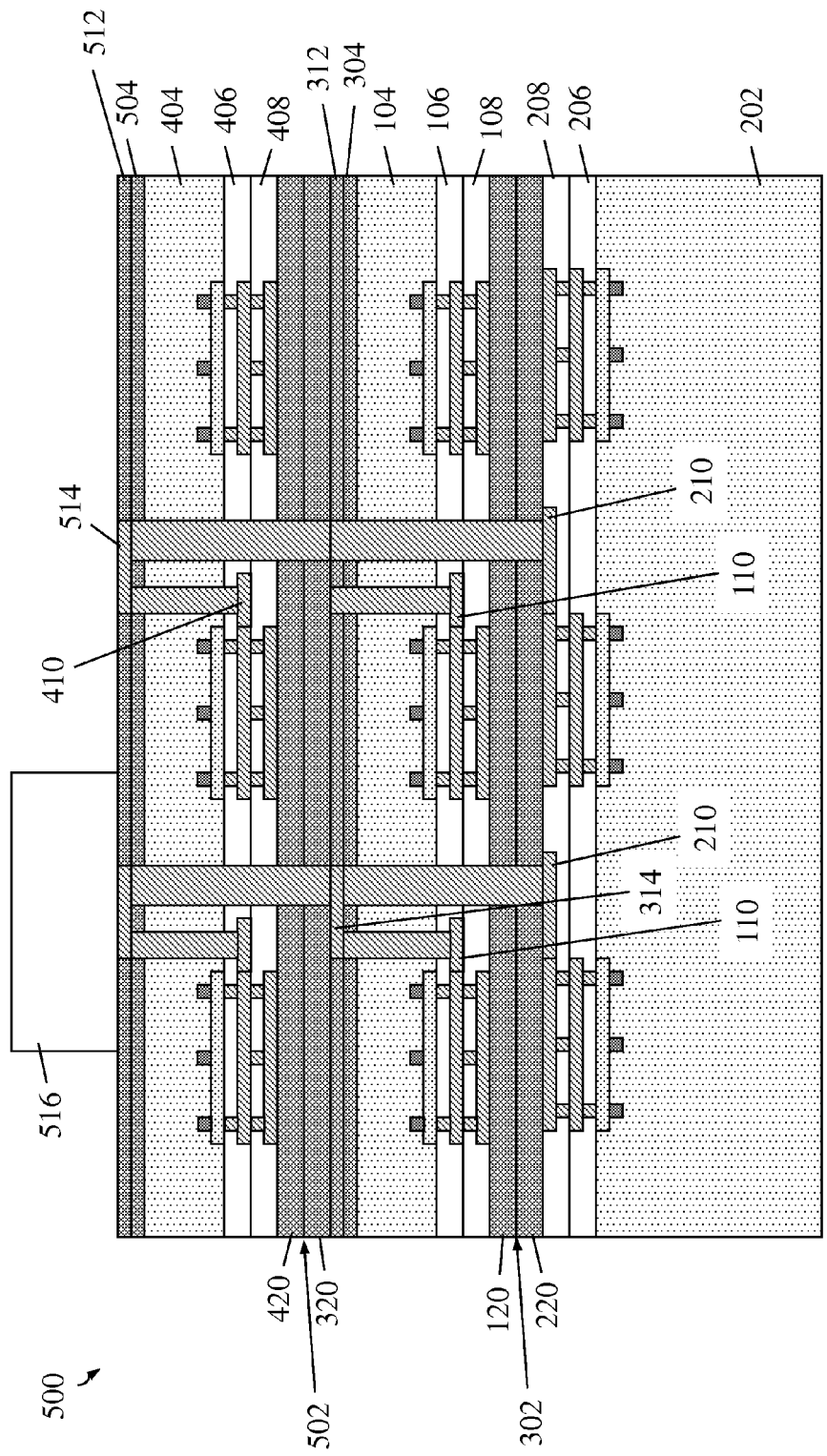

FIG. 16 depicts a capture pad 516 (e.g., C4) formed atop the wafer 500 for providing external electrical contact for the 3D integrated wafer 500. The capture pad 516 may be formed with or without another passivation layer (not shown). Prior to formation of any external capture pads, additional wafer layer may also be stacked and bonded, in the manner described above, prior to a "via last" definition that electrically interconnects the bonded wafers. In so doing, all bonding processes may essentially be insulator-to-insulator in that no alignment/bonding of conductive via structures need take place for the integration. It is noted that although the deep TSVs ultimately pass through a wafer bonding interface, the vias themselves do not comprise a part of that interface since the metal fill takes place post-bonding.

The presently disclosed techniques allow for not only face-to-face type bonding arrangements, but also face-to-back bonding, face-to-face-to-back bonding, and other variations of bonding combinations. It should also be understood that the exemplary process flows described herein may have many other variations including, but not limited to, the use of straight, "via only" wafers, wafers with only wiring redistribution and wafer connection TSVs, and wafers having specific features such as capacitors, voltage regulator modules (VRMs), etc. In addition, the various wafers (e.g., processors, memory wafers) may also include buried oxide (BOX) layers therein for SOI applications.

Figure 17:
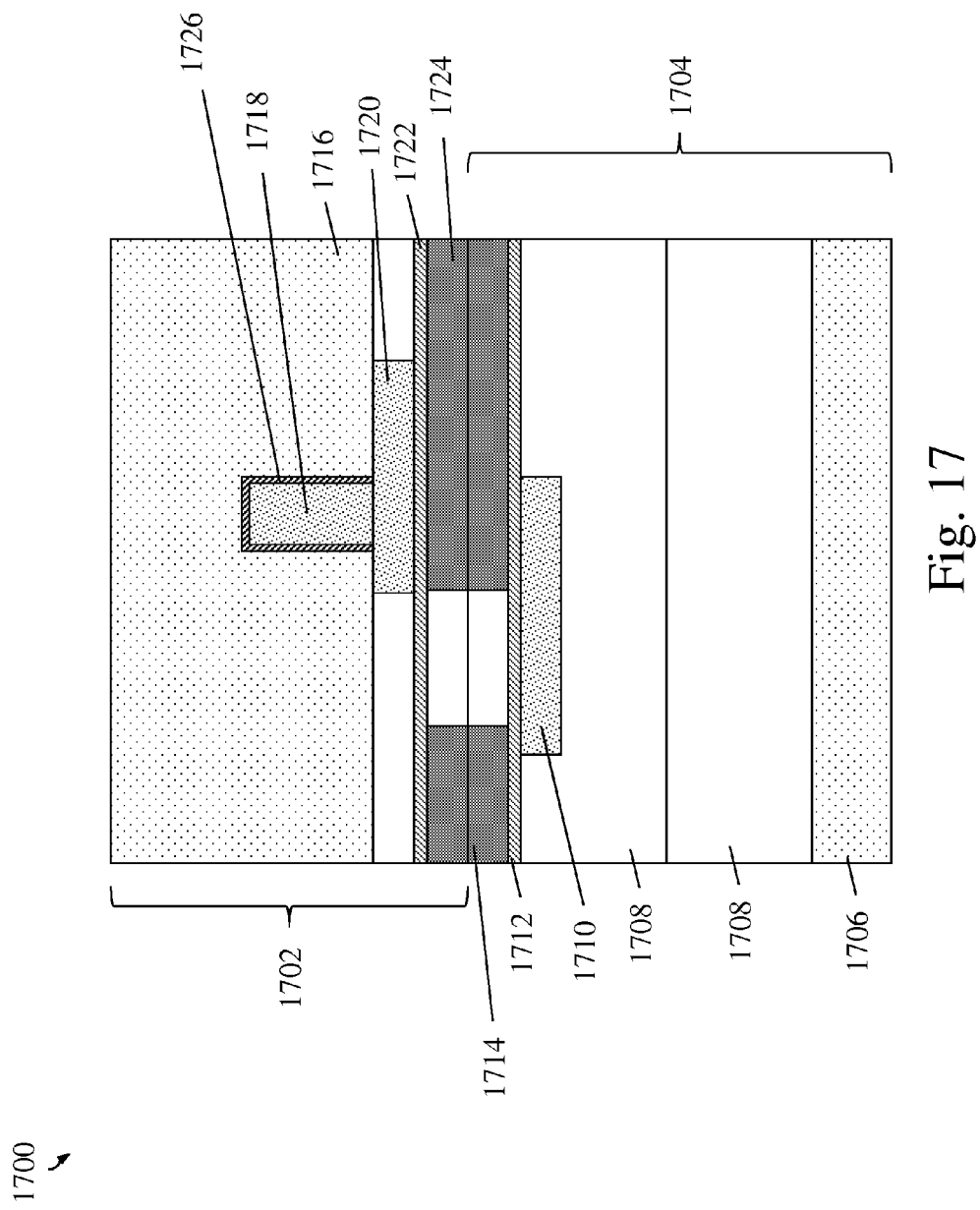

Referring generally now to FIGS. 17 through 26 there are shown a series of cross-sectional views illustrating additional details regarding implementing three-dimensional integration of multiple IC devices with alignment via/dielectric bonding first and through via formation last, in accordance with another exemplary embodiment. As shown in FIG. 17, an integrated IC structure 1700 has a top wafer 1702 that is flipped and face-to-face bonded to a bottom wafer 1704. The bottom wafer 1704 may generally include a substrate layer 1706, one or more interlevel dielectric layers 1708, a top wiring layer 1710, an optional oxide dielectric layer 1712, and a bonding interface layer 1714. The top wafer 1702 may generally include a semiconductor substrate region 1716 (e.g., silicon), an alignment via 1718 formed therein, in contact with a top wiring layer 1720, an optional oxide dielectric layer 1722, and a bonding interface layer 1724.

The alignment via 1718 is illustrated with a liner generally indicated at 1726, wherein the alignment via 1718 is formed by patterning and etching of the substrate 1716, and formation of appropriate insulation layers (e.g., oxide) diffusion barrier layer(s) and seed layer(s) prior to plating of the metal fill material (e.g., copper), polishing and capping of the via 1718. In the illustrated embodiment, the bonding interface layers 1714, 1724, include a bondable metal such as copper (dark regions), with portions comprising an insulator material such as oxide (light regions). The insulator portions include at least regions where deep TSVs will be formed through the bonding interface and not in contact with any metal contained within the bonding regions 1714, 1724. In this manner, the top and bottom wafers 1702, 1704 may be bonded by metal (e.g., copper) bonding techniques, oxide-to-oxide bonding techniques, or combinations thereof.

Figure 18:
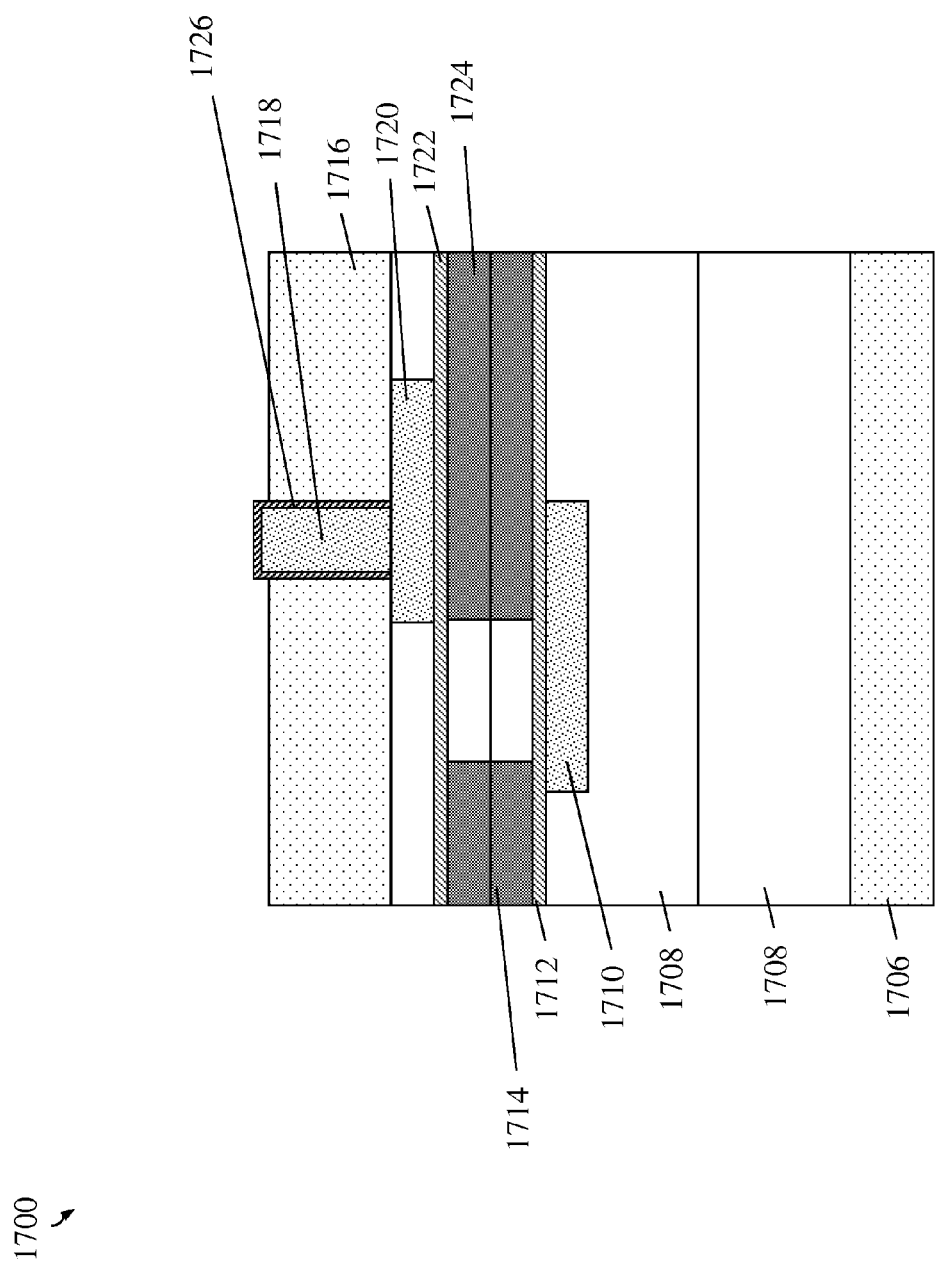

FIG. 18 illustrates thinning of the top wafer of FIG. 17. Initial thinning of the top wafer may be performed by, for example reactive ion etching (RIE) of silicon. For the last portion of the removal (e.g., within about the last 10 microns (μm) or so), wet chemical etching may be used so long as the etching chemicals do not attack insulation portion of the alignment via 1718. In addition, where allowed by the aspect ratio of the alignment via 1718, an etch resistant material may be deposited therein prior to oxide deposition to protect the oxide from etch attack. The etch endpoint is reached once the top surface of insulator layer of the liner 1726 is exposed.

Figure 19:
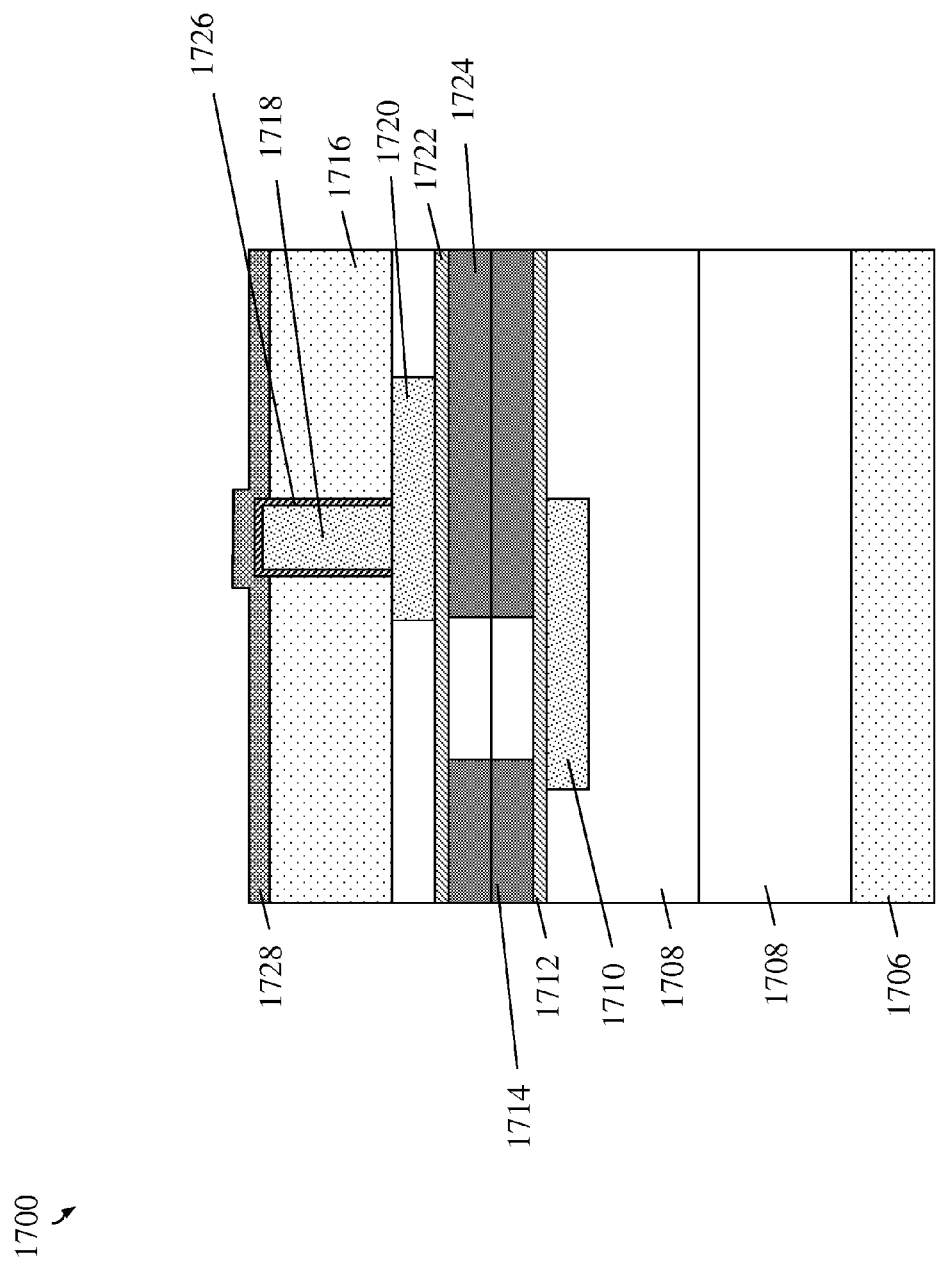
Figure 20:
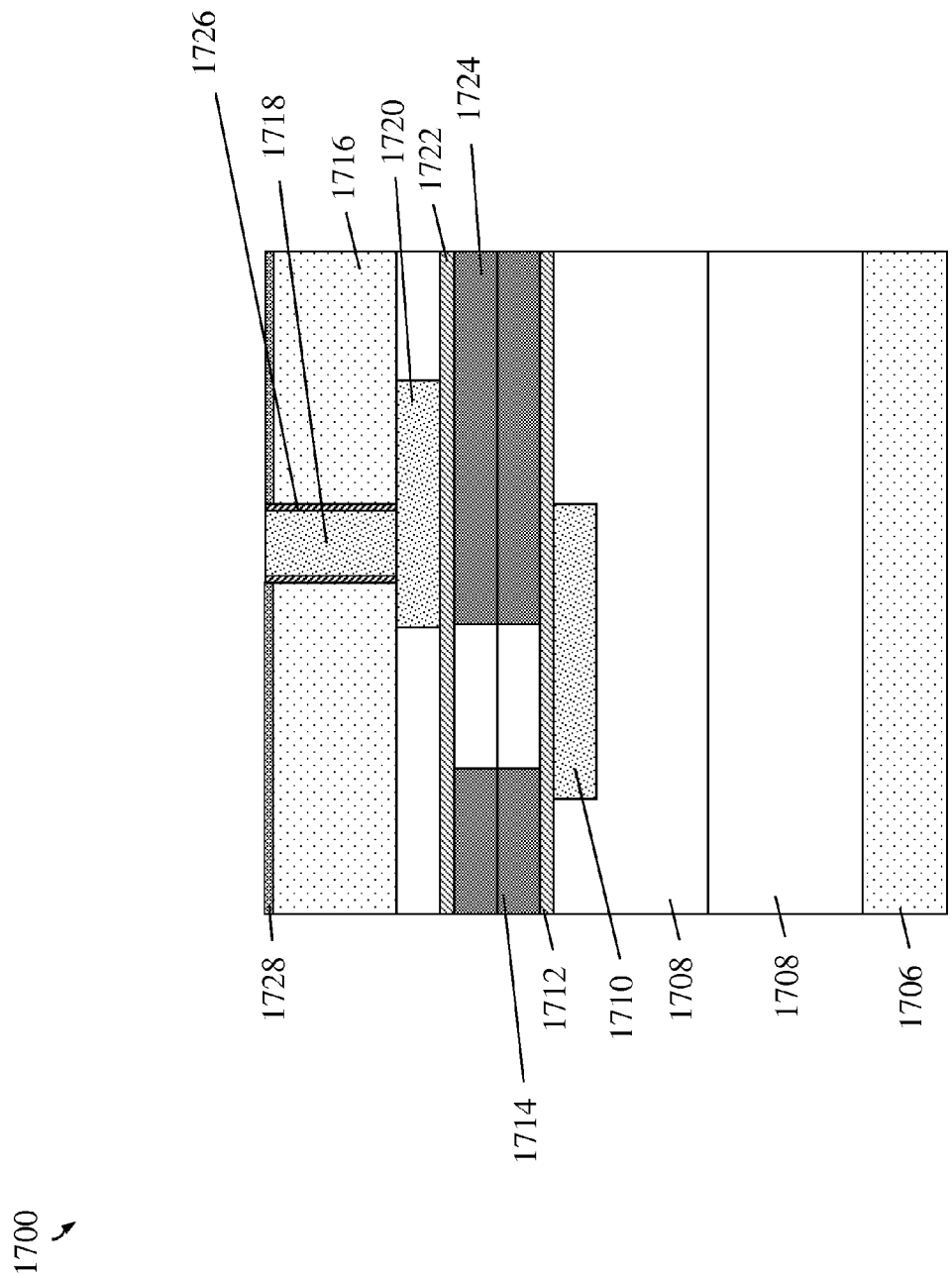
Figure 21:
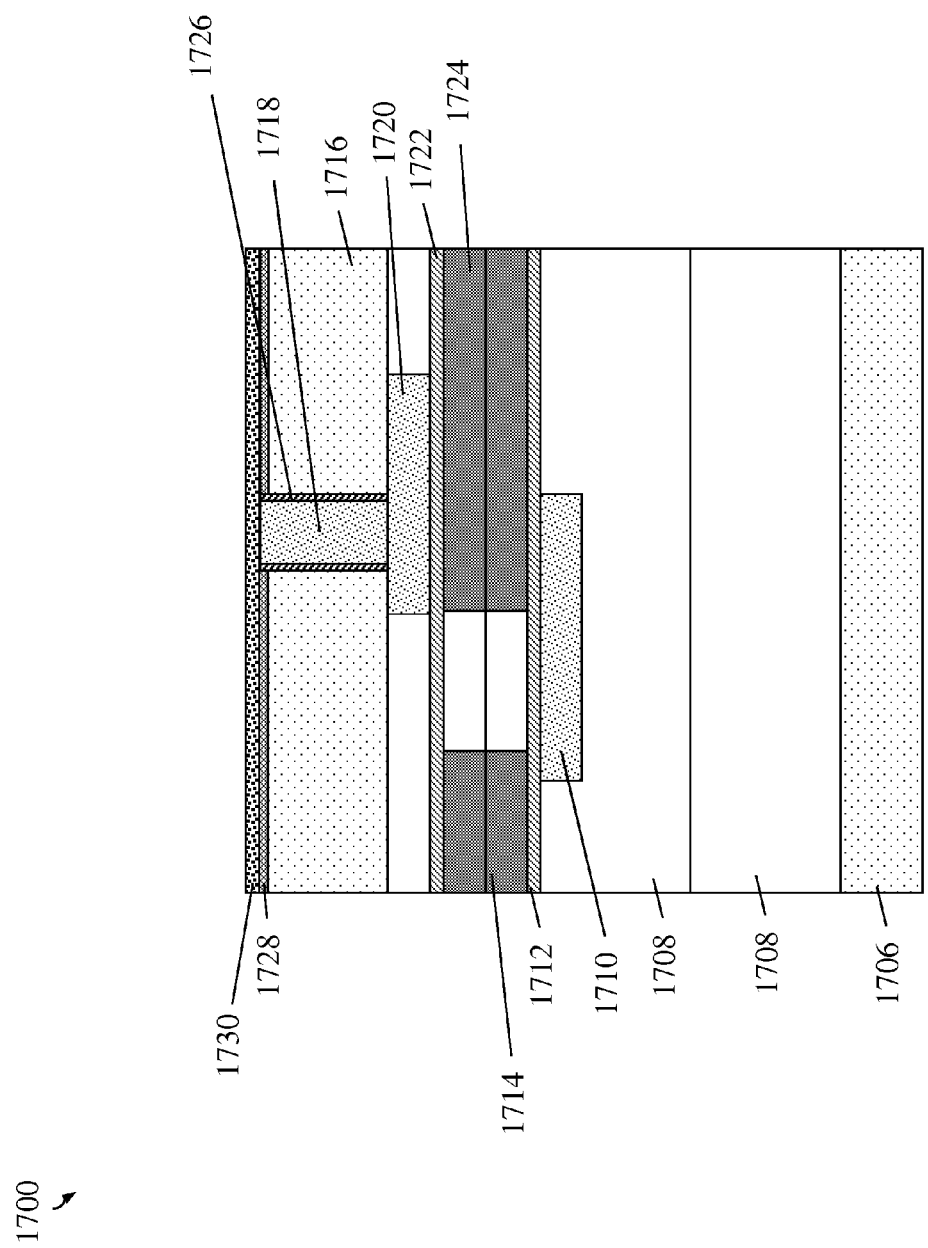

Referring next to FIG. 19, a dielectric film stack 1728 is deposited over the top of the thinned wafer and via liner 1726. The stack 1728 may include for example, alternating layers of oxide, nitride and oxide deposited by plasma enhanced chemical vapor deposition (PECVD). The dielectric stack 1726 is then thinned as shown in FIG. 20, until the fill material of the alignment via 1718 is exposed. As then illustrated in FIG. 21, a first cap layer 1730 is formed over the device in preparation of deep TSV formation. The first cap layer 1730 may include a material such as NBLoK or nitride, for example.

Figure 22:
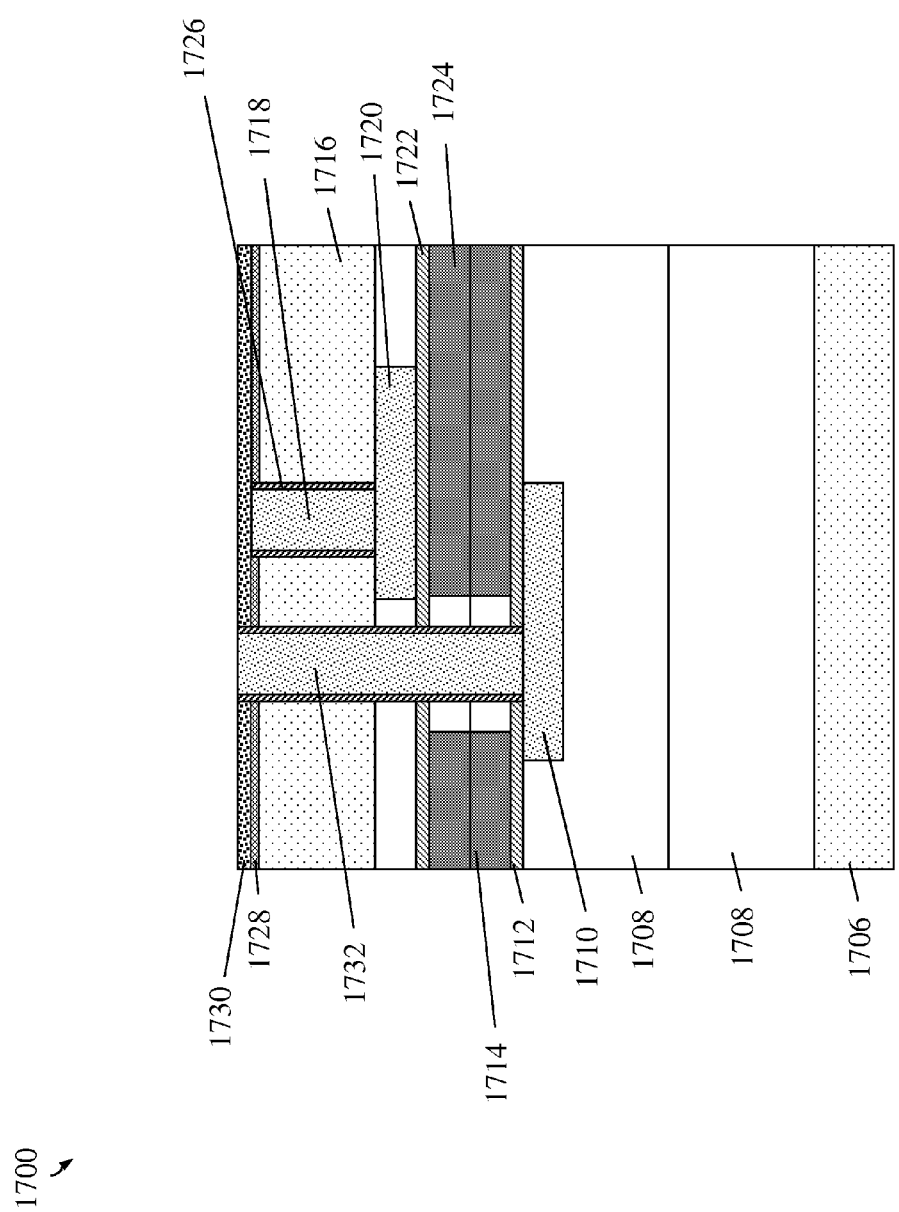
Figure 23:
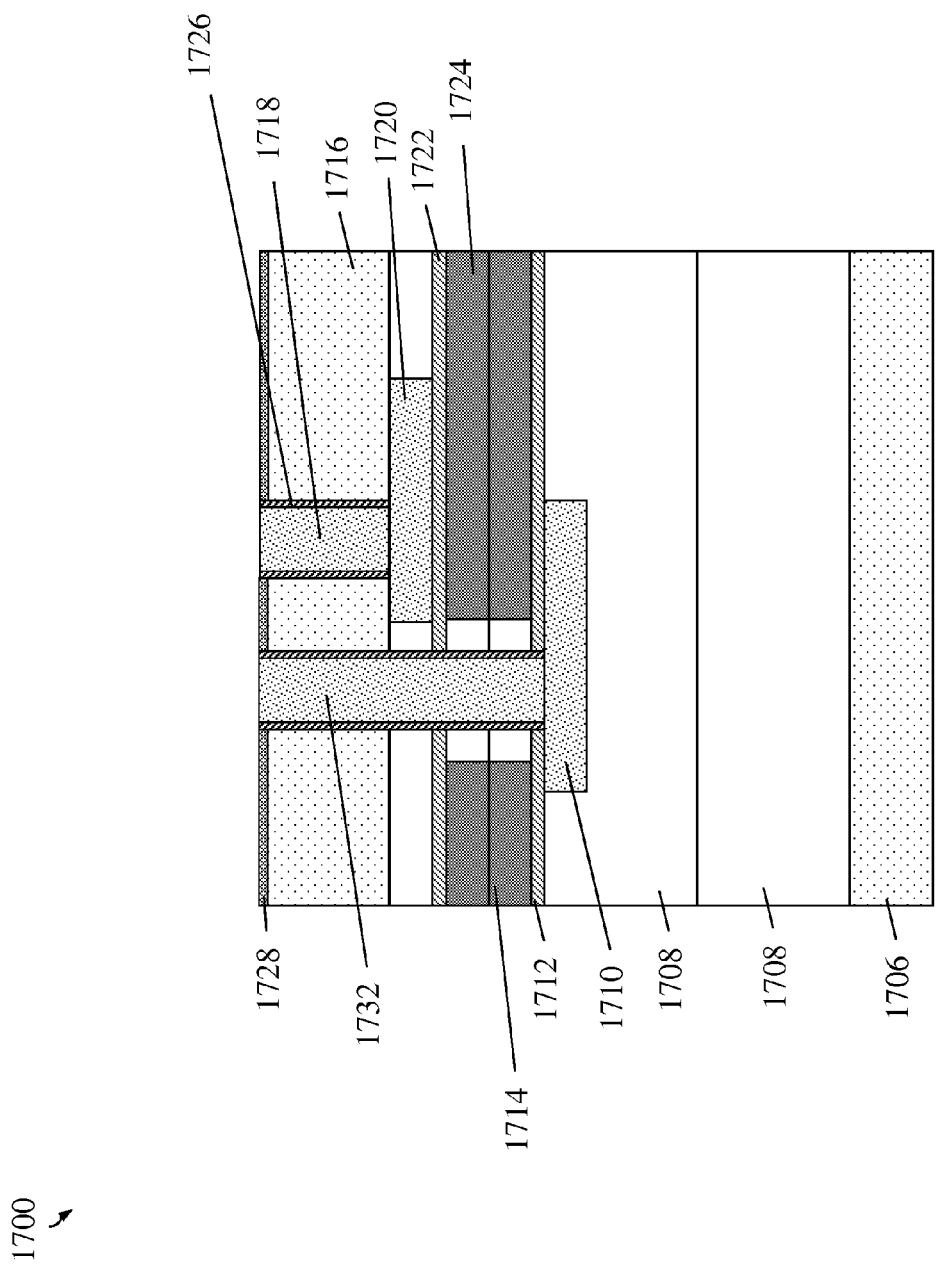

FIG. 22 illustrates the formation of a deep TSV 1732 within the integrated IC structure 1700. Using the alignment via 1718 as an alignment mark to expose a photoresist material (not shown), the deep TSV 1732 may be etched through the cap layer 1730, the dielectric stack 1728, the semiconductor substrate region 1716, dielectric containing portions of the top wiring layer 1720, the oxide dielectric layer 1722, and the insulating portions of the bonding interface layer 1724. The deep TSV further penetrates through the insulating portions of the bonding interface layer 1714 of the bottom wafer, the oxide dielectric layer 1712, and lands on the wiring layer 1710. Once etched, the deep TSV 1732 is filled with insulation, diffusion barrier and seed layers as known in the art, followed by metal plating and planarization. In FIG. 23, additional planarization both removes the first cap layer and exposes the metal fill of the alignment via 1718.

Figure 24:
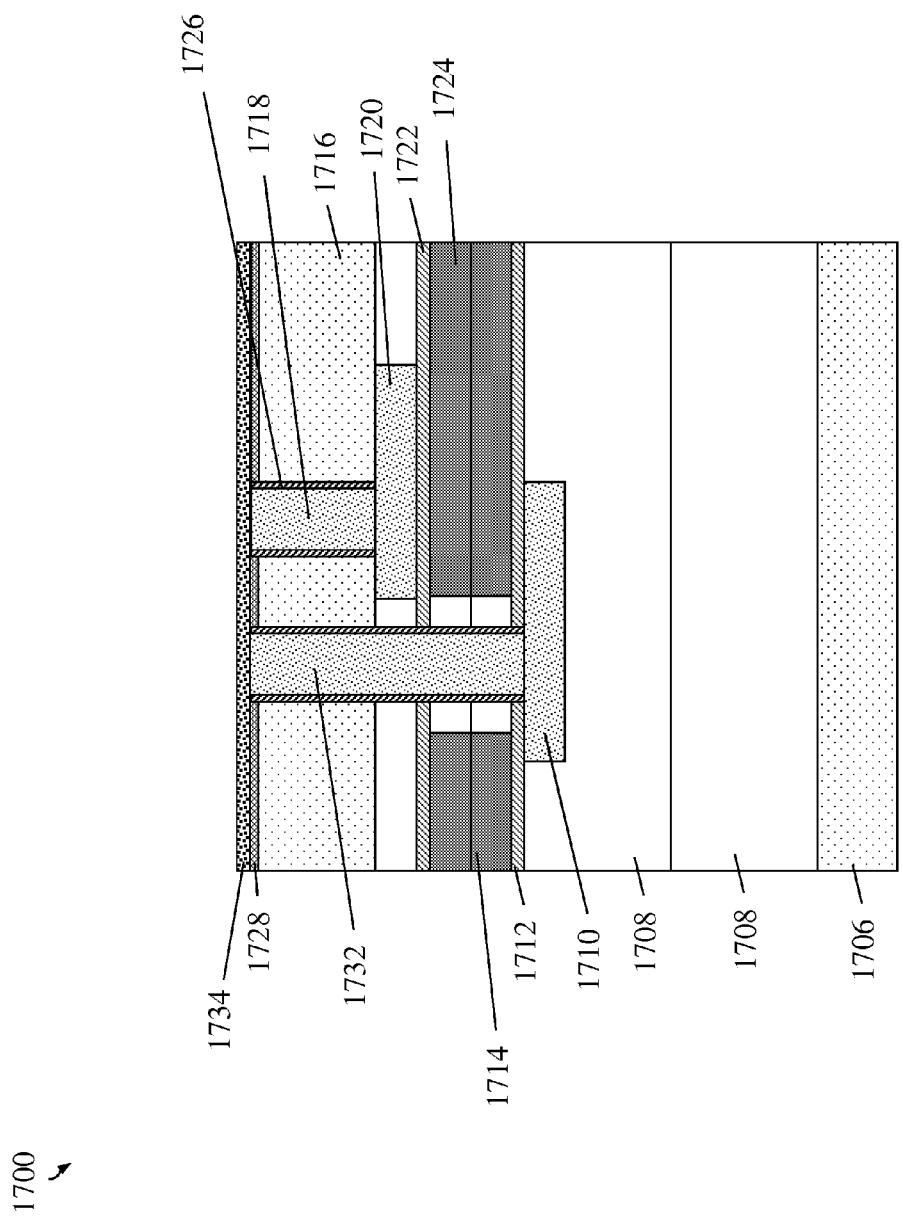
Figure 25:
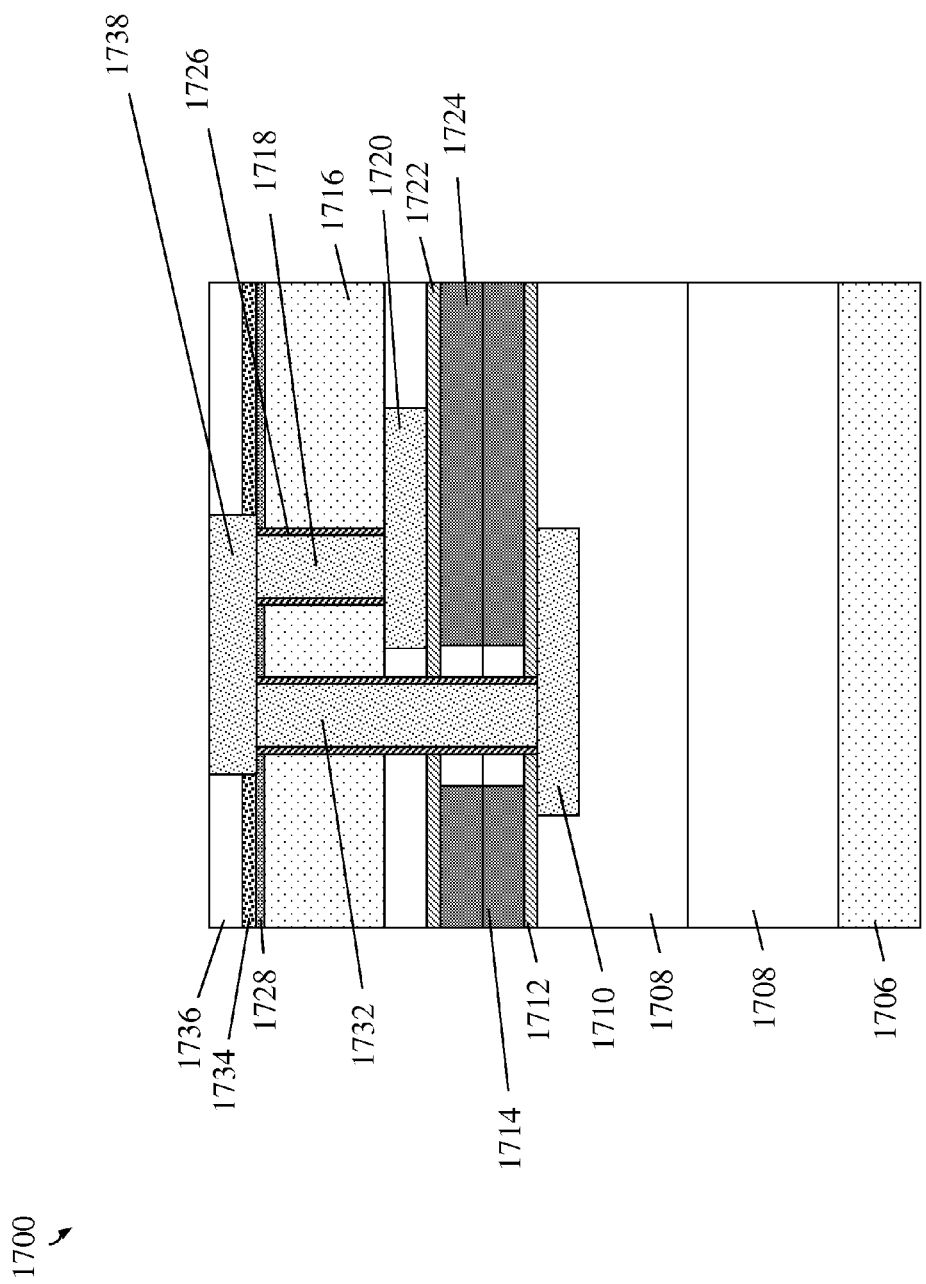

As then shown in FIG. 24, a second cap layer 1734 is formed over the structure in preparation for capture level wiring. FIG. 25 illustrates the formation of a dielectric layer 1736 such as tetraethyl orthosilicate (TEOS) for example and definition of a connecting strap 1738 between the deep TSV 1732 and the alignment via 1718.

Figure 26:
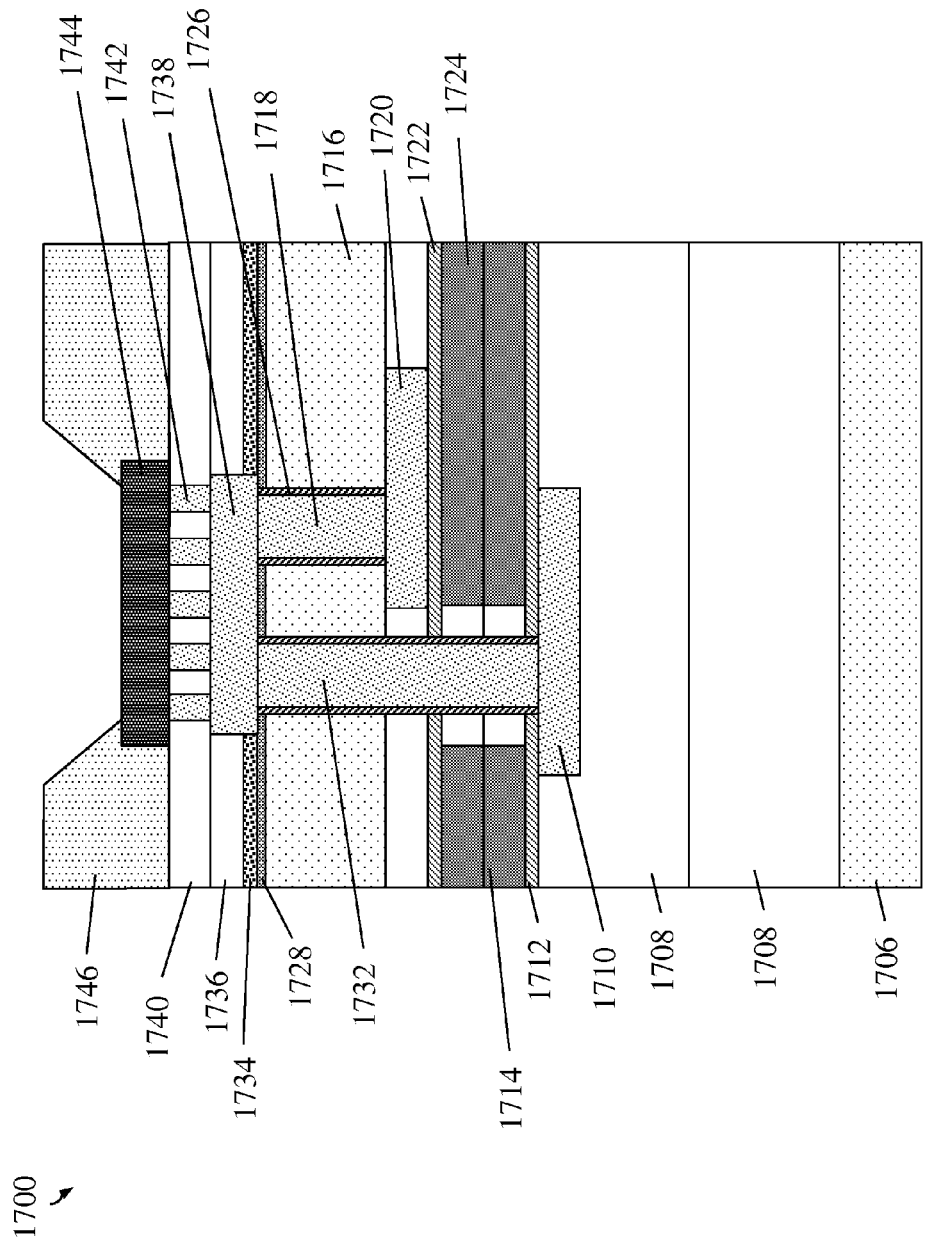

Finally, FIG. 26 illustrates final far back end of line (FBEOL) processing of the structure of FIG. 25. In this regard, an additional dielectric layer 1740 is formed, followed by connecting vias 1742 that electrically connect the strap 1738 to a bonding pad 1744 (e.g., aluminum). The top of the device is passivated with a layer 1746, such as polyimide for example, which is then patterned with openings that allow for a C4 solder connection (not shown) to the bonding pad 1744.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method, comprising:
    forming a first integrated circuit (IC) device having a first substrate, an alignment via defined in the first substrate, a first wiring layer over the alignment via, and a first bonding layer over the first wiring layer;
    forming a second IC device having a second substrate, a second wiring layer over the second substrate, and a second bonding layer over the second wiring layer;
    bonding the first bonding layer of first IC device to the second bonding layer of second IC device;
    thinning a backside of the first IC device so as to expose the alignment via; and
    using the exposed alignment via to form a deep, through substrate via (TSV) that passes through the first IC device, through a bonding interface between the first IC device and second IC device, and landing on the second wiring layer of the second IC device.

2. The method of claim 1, further comprising electrically connecting the deep TSV to the alignment via, thereby establishing electrical communication between the first and second IC devices.

3. The method of claim 1, wherein thinning the backside of the first IC device further comprises etching silicon until an insulating portion of a liner of the alignment via is exposed.

4. The method of claim 3, further comprising depositing an insulating film stack over the backside of the first IC device and exposed insulating portion of the liner of the alignment via.

5. The method of claim 4, further comprising planarizing the insulating film stack until a conductive portion of the alignment via is exposed.

6. The method of claim 5, further comprising forming a first cap layer over the insulating film stack and the exposed conductive portion of the alignment via.

7. The method of claim 6, wherein the deep TSV is formed through the first cap layer, using the alignment via.

8. The method of claim 7, further comprising planarizing the first cap layer so as to expose both the conductive portion of the alignment via and a conductive portion of the deep TSV.

9. The method of claim 8, further comprising forming a second cap layer over the deep TSV and the alignment via.

10. The method of claim 9, further comprising forming a dielectric layer over the second cap layer, the deep TSV and the alignment via, patterning the dielectric layer, and forming a conductive strap within the dielectric layer that electrically connects the deep TSV and the alignment via.

11. The method of claim 1, wherein bonding the first IC device to the second IC device comprises face-to-face bonding.

12. The method of claim 1, wherein bonding the first IC device to the second IC device comprises face-to-back bonding.

13. A method, comprising:
    forming an alignment via within a first integrated circuit (IC) device;
    forming a 3D, bonded IC device by bonding the first IC device to a second IC device so as to define a first bonding interface therebetween;
    thinning the 3D bonded IC device so as to expose the alignment via;
    using the exposed alignment via to form a first set of vias that pass through the first IC device, through the first bonding interface and into the second IC device, and land on conductive pads located within the second IC device; and forming a second set of vias within the first IC device that land on conductive pads located within the first IC device, and that do not pass through the first bonding interface.

14. The method of claim 13, further comprising filling the first and second sets of vias with a conductive material, and electrically connecting at least one via of the first set of vias to at least one via of the second set of vias, thereby establishing electrical communication between the first and second IC devices of the 3D bonded IC device.

15. The method of claim 14, wherein at least one of the second set of vias comprises the alignment via.

16. The method of claim 14, wherein the first bonding interface is formed by one or more of: oxide-to-oxide bonding, permanent adhesive bonding, metal-to-metal thermal compression bonding, and combinations thereof.

17. The method of claim 14, further comprising:
forming a second alignment via within a third IC device;
bonding the third IC device to the 3D bonded IC device so as to define a second bonding interface therebetween;
thinning the 3D bonded IC device so as to expose the second alignment via;
using the exposed second alignment via to form a third set of vias that pass through the third IC device, through the second bonding interface and into the first IC device, and land on conductive pads located within the first IC device; and
forming a fourth set of vias within the third IC device that land on conductive pads located within the third IC device, and that do not pass through the second bonding interface; and
filling the third and fourth sets of vias with a conductive material, and electrically connecting at least one via of the third set of vias to at least one via of the fourth set of vias, thereby establishing electrical communication between the first, second and third IC devices of the 3D bonded IC device.

18. The method of claim 13, wherein the first IC device comprises an epitaxially grown semiconductor layer formed on a sacrificial base layer, and wherein the sacrificial base layer is removed subsequent to bonding the first and second IC devices, and prior to formation of the first and second sets of vias.

19. The method of claim 18, wherein the sacrificial base layer of the first IC device has a substantially higher dopant concentration with respect to the epitaxially grown semiconductor layer so as to create an etch selectivity therebetween.

20. The method of claim 17, wherein bonding of the first, second and third IC devices comprises one or more of: face-to-face bonding, face-to-back bonding, and face-to-face-to-back bonding.

* * * * *